United States Patent
Misumi et al.

(10) Patent No.: US 7,248,503 B2
(45) Date of Patent: Jul. 24, 2007

(54) SEMICONDUCTOR NONVOLATILE STORAGE DEVICE

(75) Inventors: Kenji Misumi, Osaka (JP); Atsushi Fujiwara, Osaka (JP); Masanori Matsuura, Osaka (JP); Toshio Nishimoto, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 106 days.

(21) Appl. No.: 11/242,894

(22) Filed: Oct. 5, 2005

(65) Prior Publication Data
US 2006/0023514 A1    Feb. 2, 2006

Related U.S. Application Data

(63) Continuation of application No. 10/781,808, filed on Feb. 20, 2004, now Pat. No. 6,999,349.

(30) Foreign Application Priority Data
Feb. 21, 2003   (JP)  ............... P.2003-044706

(51) Int. Cl.
*G11C 16/04*   (2006.01)
(52) U.S. Cl. ............... 365/185.28; 365/185.18; 365/185.29

(58) Field of Classification Search ........... 365/185.28, 365/185.18, 185.21, 185.22, 185.03
See application file for complete search history.

(56) References Cited

U.S. PATENT DOCUMENTS

| | | | |
|---|---|---|---|
| 5,051,953 | A | 9/1991 | Kitazawa |
| 5,436,913 | A | 7/1995 | Yamamura et al. |
| 5,793,674 | A | 8/1998 | Kubo et al. |
| 5,933,366 | A | 8/1999 | Yoshikawa |
| 6,046,933 | A * | 4/2000 | Nobukata et al. ...... 365/185.03 |
| 6,157,573 | A | 12/2000 | Ishii et al. |
| 6,243,292 | B1 | 6/2001 | Kobayashi et al. |
| 6,259,624 | B1 | 7/2001 | Nobukata |
| 6,456,532 | B1 | 9/2002 | Ohmi et al. |
| 6,680,868 | B2 * | 1/2004 | Akamatsu ............... 365/189.04 |

FOREIGN PATENT DOCUMENTS

| | | |
|---|---|---|
| JP | 04-291644 | 10/1992 |
| JP | 04-337666 | 11/1992 |
| WO | WO 01/84552 A2 | 11/2001 |

* cited by examiner

*Primary Examiner*—Gene N. Auduong
(74) *Attorney, Agent, or Firm*—McDermott Will & Emery LLP

(57) ABSTRACT

A writing operation selecting circuit is provided for selecting a temporary writing operation having a prescribed writing time for a memory cell transistor element and an additional writing operation for the memory cell transistor element. A writing time control circuit is provided for controlling an additional writing operation time by an output signal of the writing operation selecting circuit.

35 Claims, 24 Drawing Sheets

FIG. 18

SEMICONDUCTOR NONVOLATILE STORAGE DEVICE

The present application is a continuation of U.S. application Ser. No. 10/781,808 filed Feb. 20, 2004 now U.S. Pat. No. 6,999,349, which is based on Japanese Patent Application No. 2003-044706, which is incorporated herein by reference.

BACKGROUND OF THE INVENTION

1. Field of the Invention

The present invention relates to a semiconductor nonvolatile storage device in which data can be electrically erased or written.

2. Description of the Related Art

In a usual semiconductor nonvolatile storage device, an EEPROM will be described below as an example by referring to the drawings.

FIG. 23 shows a block diagram of a usual EEPROM (semiconductor nonvolatile storage device) which decreases time necessary for wiring data from a host device. FIG. 24 shows a threshold voltage distribution diagram in the erasing state and the writing state of the usual EEPROM (semiconductor nonvolatile storage device).

As shown in FIG. 23, a structure including an interface circuit 101 for an EEPROM, an EEPREOM 1400, an interface circuit 1301 for a SRAM and a SRAM 1300 is employed as one example of a structure for shortening the time necessary for writing data from the host device.

In FIG. 23, the EEPROM 1400 includes a memory cell transistor array 110, a sense amplify circuit 120, a write data latch circuit 130, an address decoder circuit 140, a high voltage control circuit 150 and a control circuit 160. The SRAM 1300 includes a memory cell transistor array 1310, a sense amplify circuit 1320, an address decoder circuit 1340 and a control circuit 1360.

Now, a writing operation in the EEPROM 1400 will be described below.

For a writing instruction from the host device, data is temporarily written at high speed in the SRAM 1300 through the interface circuit 1301 for the SRAM. After the writing instruction from the host device is completed, the data stored in the SRAM 1300 is written in the EEPROM 1400 through the interface circuit 1301 for the SRAM and the interface circuit 101 for the EEPROM. The SRAM 1300 and the EEPROM have usual ordinary structures.

In order to read the data of the SRAM 1300 for a reading instruction from the host device, the data is read through the interface circuit 1301 for the SRAM. Similarly, in order to read the data of the EEPROM 1400, the data is read through the interface circuit 101 for the EEPROM.

In accordance with these operations, after the data is temporarily written in the SRAM 1300 at high speed upon writing the data, the data is written in the EEPROM 1400 so that the nonvolatile characteristics of the stored data are realized. (for instance, see Patent Document 1.).

[Patent Document 1]
Unexamined Japanese Patent Publication No. Hei-4-291644

[Patent Document 2]
Unexamined Japanese Patent Publication No. Hei-4-337666

The above-described usual semiconductor nonvolatile storage device has needed to include an auxiliary memory (SRAM or the like) capable of writing data at high speed to shorten time necessary for writing data from a host device.

As described above, when the auxiliary memory (SRAM or the like) is disposed in an LSI as a semiconductor nonvolatile storage device, the increase of the area of the LSI cannot be avoided. Thus, the cost of the semiconductor nonvolatile storage device has been inconveniently greatly increased.

SUMMARY OF THE INVENTION

The present invention is provided by taking the above-described problem into consideration and it is an object of the present invention to provide a semiconductor nonvolatile storage device capable of extremely shortening time necessary for writing data from a host device without greatly increasing a cost, because an auxiliary memory (SRAM or the like) does not need to be included.

In order to solve the above-described problem, a semiconductor nonvolatile storage device according to the present invention comprises: a writing operation selecting circuit for selecting a temporary writing operation having a prescribed writing time for a memory cell transistor element and an additional writing operation for the memory cell transistor element; and a writing time control circuit for controlling the time of the additional writing operation in accordance with the output signal of the writing operation selecting circuit.

Data written in the memory cell transistor element by the temporary writing operation may be discriminated and the discriminated data may be transferred to a write data holding circuit for the additional writing operation.

According to the above-described structure, only the temporary writing operation necessary at the minimum for a normal operation of an initial reading is temporarily carried out for a writing instruction from a host device to shorten a writing time. After that, temporarily written data written in the semiconductor nonvolatile storage device is transferred to a write data latch circuit by using a sense amplify circuit, and then, the additional writing operation necessary for ensuring a reliability is performed on the basis of the data of the write data latch circuit. Thus, the reliability can be ensured.

A semiconductor nonvolatile storage device preferably includes a verifying operation control circuit for controlling a verifying operation for discriminating whether or not the data is normally written in the memory cell transistor element by the temporary writing operation; and a verifying circuit for performing the verifying operation in accordance with the output signal of the verifying operation control circuit are included.

According to this structure, unevenness in writing characteristics due to unevenness in manufacture of the memory cell transistor or circuit characteristics can be reduced. Further, the writing time in the temporary writing operation can be suppressed to a minimum as much as possible.

A semiconductor nonvolatile storage device preferably includes a writing voltage setting circuit for controlling the set value of writing voltage in accordance with the output signal of the writing operation selecting circuit is included.

According to the above-described structure, the writing voltage in the temporary writing operation can be set higher than voltage in the additional writing operation so that the writing time in the temporary writing operation can be shortened.

An erasing operation may be performed before the additional writing operation is performed.

According to the above-described structure, when the threshold voltage of the memory cell transistor which desires to hold data in an erased state is brought into a low erased state by the temporary writing operation, the temporary writing operation is performed to discriminate the data written in the memory cell transistor element and the discriminated data is transferred to the write data holding circuit for the additional writing operation. After an ordinary erasing operation is performed for a writing block in a memory cell transistor array for performing the additional writing operation, the additional writing operation is performed. Thus, the reliability of erased data and write data can be ensured.

A semiconductor nonvolatile storage device preferably includes an erasing operation selecting circuit for selecting a primary erasing operation having a prescribed erasing time for the memory cell transistor element and a secondary erasing operation having an erasing time longer than that of the primary erasing operation and an erasing time control circuit for controlling the erasing time in accordance with the output signal of the erasing operation selecting circuit are included.

According to the above-described structure, only the primary erasing operation and the temporary writing operation necessary at the minimum for the normal operation of an initial reading are temporarily carried out for the writing instruction from the host device to shorten the erasing time and the writing time. After that, the temporarily written data written in the semiconductor nonvolatile storage device is transferred to the write data latch circuit by using the sense amplify circuit, and then, the secondary erasing operation and the additional writing operation necessary for ensuring a reliability are performed on the basis of the data of the write data latch circuit. Thus, the reliability can be ensured.

A semiconductor nonvolatile storage device preferably includes a reading operation selecting circuit capable of selecting a temporary reading operation after the temporary writing operation and a reading operation after the additional writing operation is provided.

Further, a semiconductor nonvolatile storage device preferably includes a reading voltage setting circuit provided to which the output signal of the reading operation selecting circuit is connected and in which the set value of word line voltage is set to temporary reading voltage, when the output signal indicates the temporary reading operation.

According to the above-described structure, when the threshold voltage of the memory cell transistor after the writing operation is higher than the threshold voltage of the memory cell transistor after the erasing operation, the reading voltage of the temporarily written data is set to voltage lower than the reading voltage. Even when the threshold voltage of the memory cell transistor after the writing operation is low, the data can be precisely discriminated and the writing time can be shortened.

A semiconductor nonvolatile storage device preferably includes a reference current setting circuit provided for allowing reference current as a decision reference of electric current to flow to the memory cell transistor element when read data is decided and controlling the set value of the reference current in accordance with the output signal of the reading operation selecting circuit.

According to the above-described structure, when the threshold voltage of the memory cell transistor after the writing operation is lower than the threshold voltage of the memory cell transistor after the erasing operation, the reference current upon reading the temporarily written data is set lower than the reference current upon reading the additionally written data. Thus, even when the threshold voltage of the memory cell transistor after the writing operation is low, the data can be correctly discriminated, the writing time can be shortened and more effects can be obtained in a transistor having low threshold voltage.

The write data holding circuit may include a latch provided at the rate of one for each bit line or several bit lines and a transfer gate for electrically separating the latch from the bit line, and further includes a bit line potential detecting circuit for detecting the voltage of the bit line and a latch invert circuit for inverting the data of the latch in accordance with the output of the bit line potential detecting circuit.

According to the above-described structure, a program verifying operation and a data transferring operation can be simultaneously performed for a selected memory cell and the program verifying operation and the data transferring operation can be performed at high speed.

A semiconductor nonvolatile storage device preferably includes an interrupt input circuit provided in which when data is written for each writing block in the memory cell transistor array and when a writing instruction is inputted during performing the additional writing operation, the input of the writing instruction is permitted without performing the additional writing operation in other writing blocks after the additional writing operation is completed.

Further, a semiconductor nonvolatile storage device preferably includes a ready/busy output circuit provided for informing about the inhibition of the input of write data while the additional writing operation is performed.

According to the above-described structure, a state that the writing instruction cannot be inputted by a ready/busy signal from the host device during performing the additional writing operation can be recognized. Further, an interrupt signal is inputted from the host device to stop the additional writing operation to a next writing block. Thus, a waiting time for the input of a temporary writing instruction of the host device can be shortened.

A writing flag may be provided for storing whether a writing state of data for each writing block in the memory cell transistor array is one of after the temporary writing operation (temporary waiting state) and after the additional writing operation (additional writing state) for each writing block.

Further, the additional writing operation may be controlled to be performed for the writing block after the temporary writing operation on the basis of the information of the writing flag.

According to the above-described structure, even when the temporary writing state and the additional writing state exist at the same time, it can be discriminated which writing block is in a state that data is temporarily written. Thus, the additional writing operation may be performed only for the writing block in which the data is temporarily written, so that an efficient writing operation can be performed.

A semiconductor nonvolatile storage device preferably includes a word line voltage switching circuit provided for changing the reading voltage applied to a word line upon reading operation on the basis of the information of the writing flag.

According to the above-described structure, the data in the writing flag is previously read upon reading operation and when the data is in a memory cell which is in a state that the data is temporarily written, the reading voltage applied to the word line is changed by the word line voltage switching circuit. Thus, reading speed can be accelerated.

Therefore, in read data, the temporarily written data can be read at the same reading speed as ordinary reading speed without considering the difference in reading speed of memory cells, which occurs by performing the temporary writing operation.

A semiconductor nonvolatile storage device preferably includes a selector provided for selecting any of a plurality of semiconductor nonvolatile storage devices and controlling an operation.

A semiconductor nonvolatile storage device preferably includes a ready/busy output circuit provided for outputting an instruction for inhibiting the input of the write data to the selector while the additional writing operation is performed.

According to the above-described structure, after the temporary writing operation is performed in one of the plurality of semiconductor nonvolatile storage devices, the additional writing operation is performed. Then, during the period of the additional writing operation, the temporary writing operation is performed in other semiconductor nonvolatile storage device at the same time. Thus, the waiting time of the host device relative to the writing time of the data can be shortened.

A semiconductor nonvolatile storage device preferably includes an ECC circuit.

According to the above-described structure, even when there is a memory cell transistor in which the threshold voltage after the temporary writing operation is low and the data is discriminated as erase data by the sense amplify circuit, if the number of bits of the data can be corrected in the ECC circuit, the corrected data can be transferred to the write data holding circuit by the data transferring circuit. Thus, the correct data can be additionally written.

As described above, according to the present invention, two kinds of writing operations including the temporary writing operation and the additional writing operation can be performed as a writing system for the same nonvolatile memory cell transistor array. Thus, for the writing instruction from the host device, the temporary writing operation can shorten the writing time. The reliability of the data can be assuredly maintained by a subsequent additional writing operation.

Still further, a controlling method of writing a semiconductor nonvolatile storage device according to the present invention comprises: a step of selecting a temporary writing operation having a prescribed writing time for a memory cell transistor element; and a step of controlling a time of an additional writing operation in accordance with the selection of the temporary writing operation.

BRIEF DESCRIPTION OF THE DRAWINGS

FIG. 18 is a block diagram of a semiconductor nonvolatile storage device according to an eighth embodiment;

DETAILED DESCRIPTION OF THE PREFERRED EMBODIMENTS

In each of embodiments of the present invention, even when an auxiliary memory (SRAM or the like) for shortening time necessary for writing data from a host device is not provided, the time necessary for writing the data in a semiconductor nonvolatile storage device from the host device can be greatly reduced. Now, an EEPROM will be described in detail as an example of the semiconductor nonvolatile storage device.

First Embodiment

A first embodiment of the present invention will be described with reference to FIGS. 1, 2 and 3.

Figure 1:
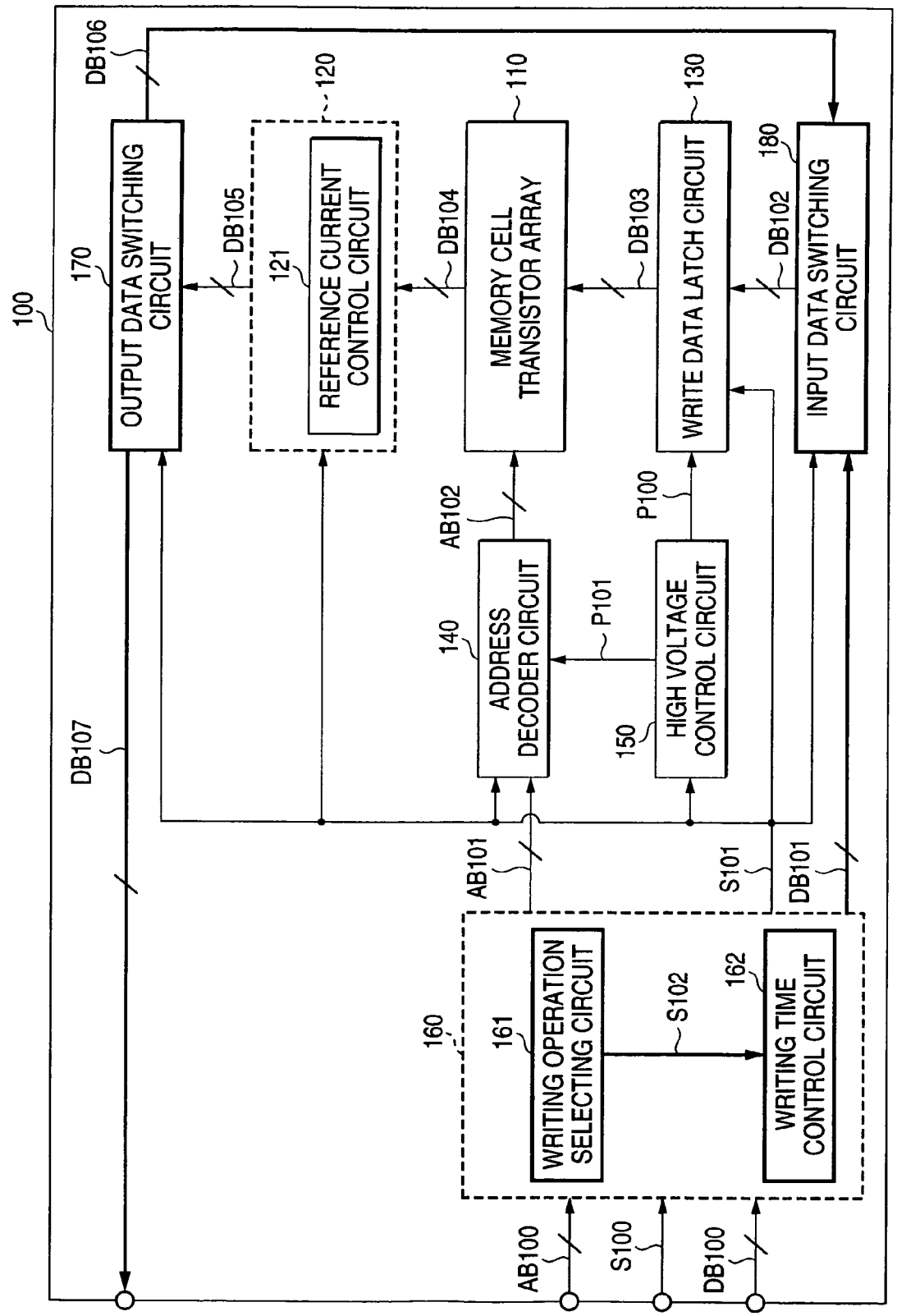
FIG. 1 is a block diagram of a semiconductor nonvolatile storage device according to a first embodiment.

FIG. 1 is a diagram showing the structure of the EEPROM according to the first embodiment.

Figure 2A:
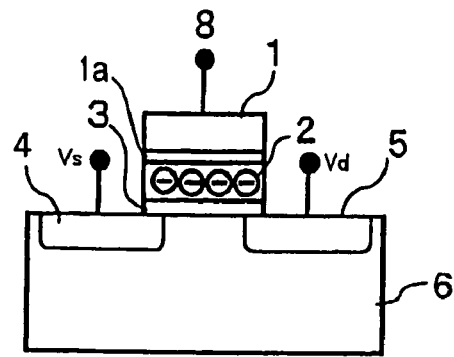
FIG. 2A is a sectional view of a floating gate type memory cell transistor.
Figure 2B:
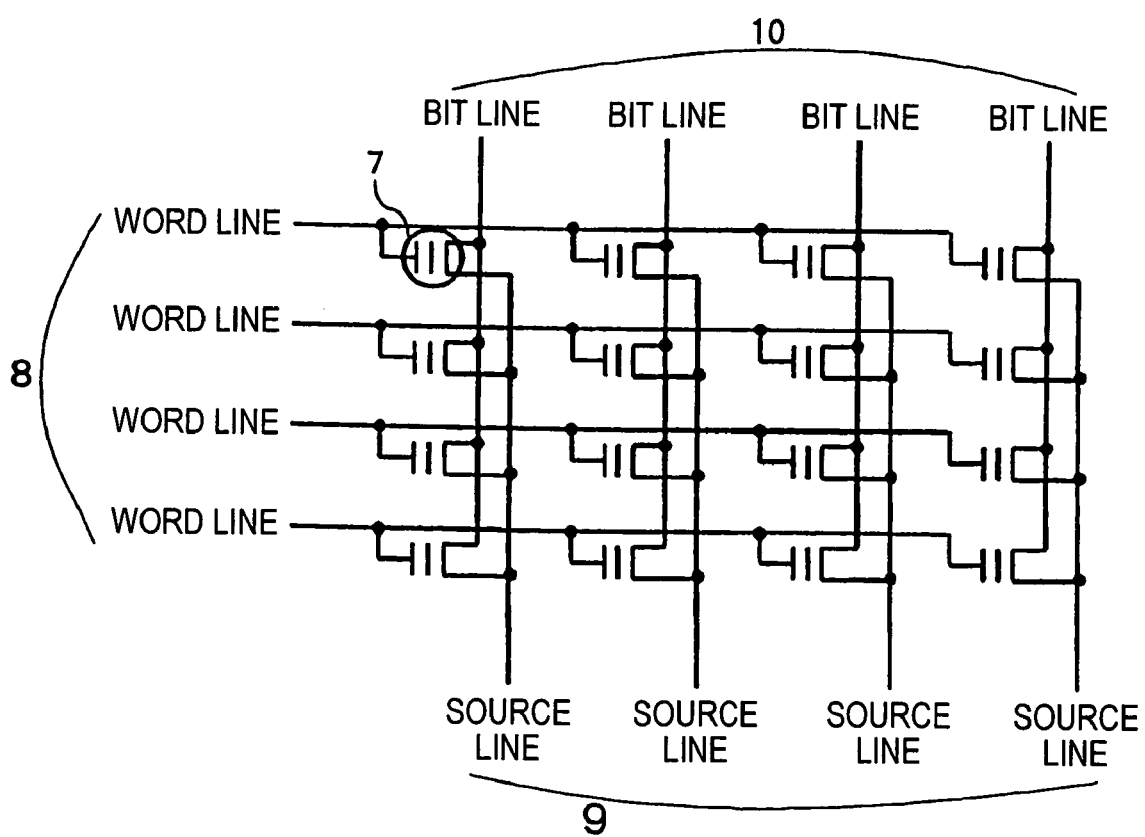
FIG. 2B is a block diagram of a memory cell transistor array.

FIG. 2A is a sectional view of a floating gate type memory cell transistor and FIG. 2B shows the structure of a memory cell transistor array in the EEPROM according to the first embodiment.

Figure 3A:
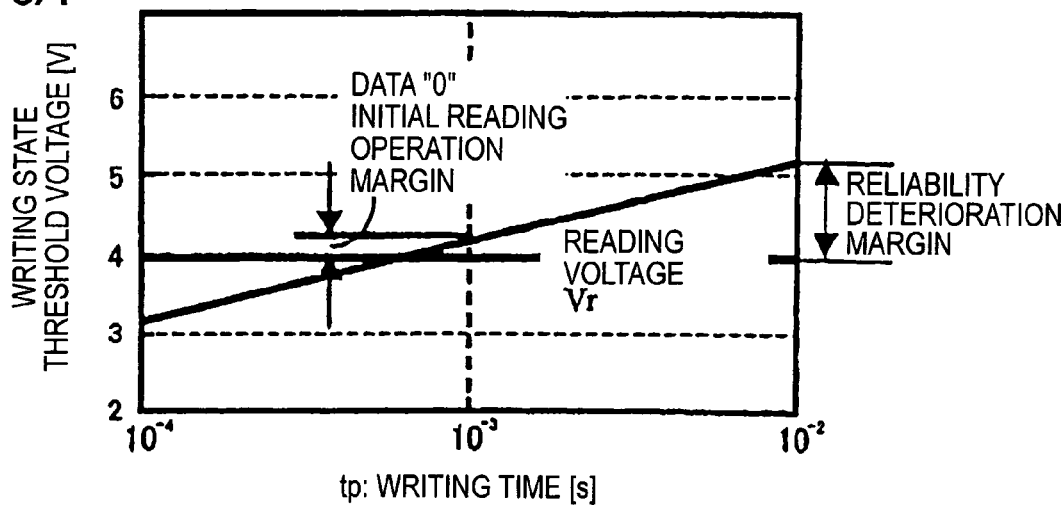
FIG. 3A is a view showing the dependence of writing state threshold voltage on time.
Figure 3B:
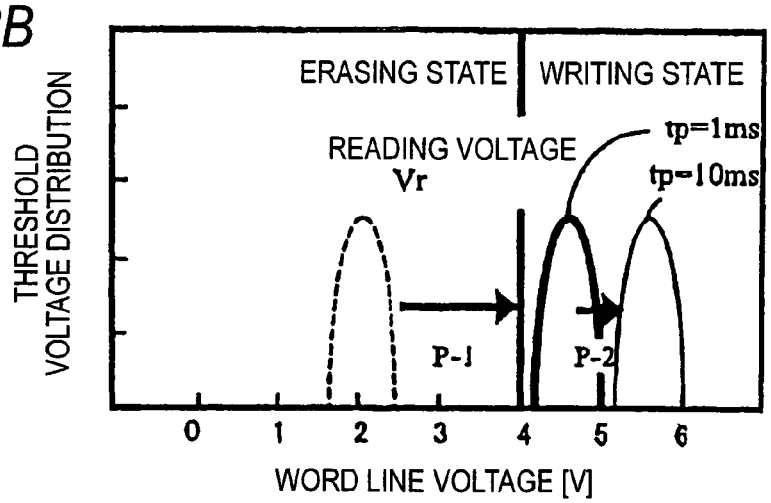
FIG. 3B shows a threshold voltage distribution and FIG. 3C is a view showing the dependence of memory cell current on word line voltage in the first embodiment.
Figure 3C:
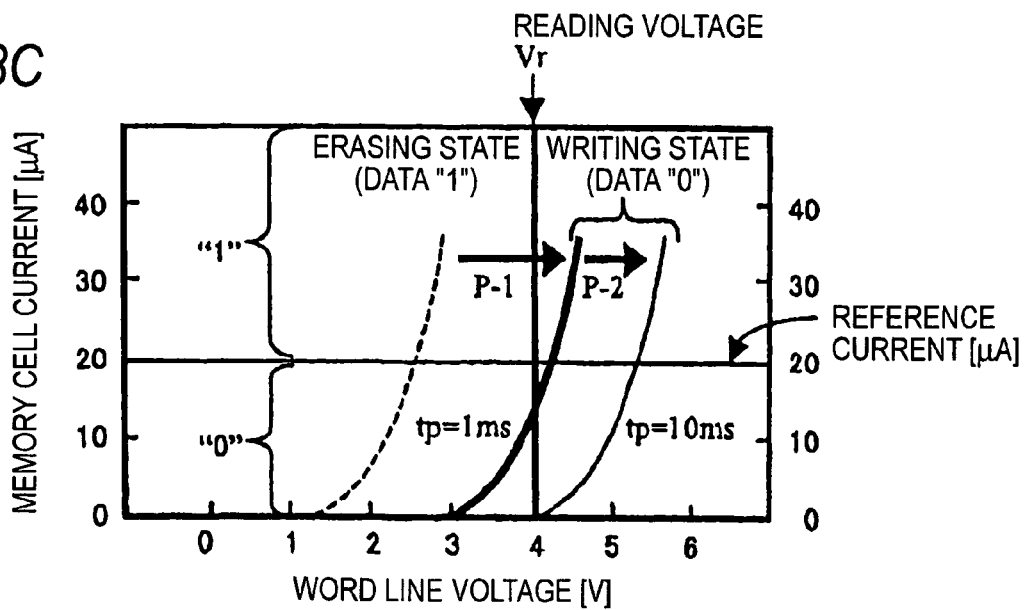

FIG. 3A shows a dependence of threshold voltage in a writing state on writing time, FIG. 3B shows a threshold voltage distribution and FIG. 3C shows a dependence of memory cell current on word line voltage in the EEPROM according to the first embodiment.

Figure 23:
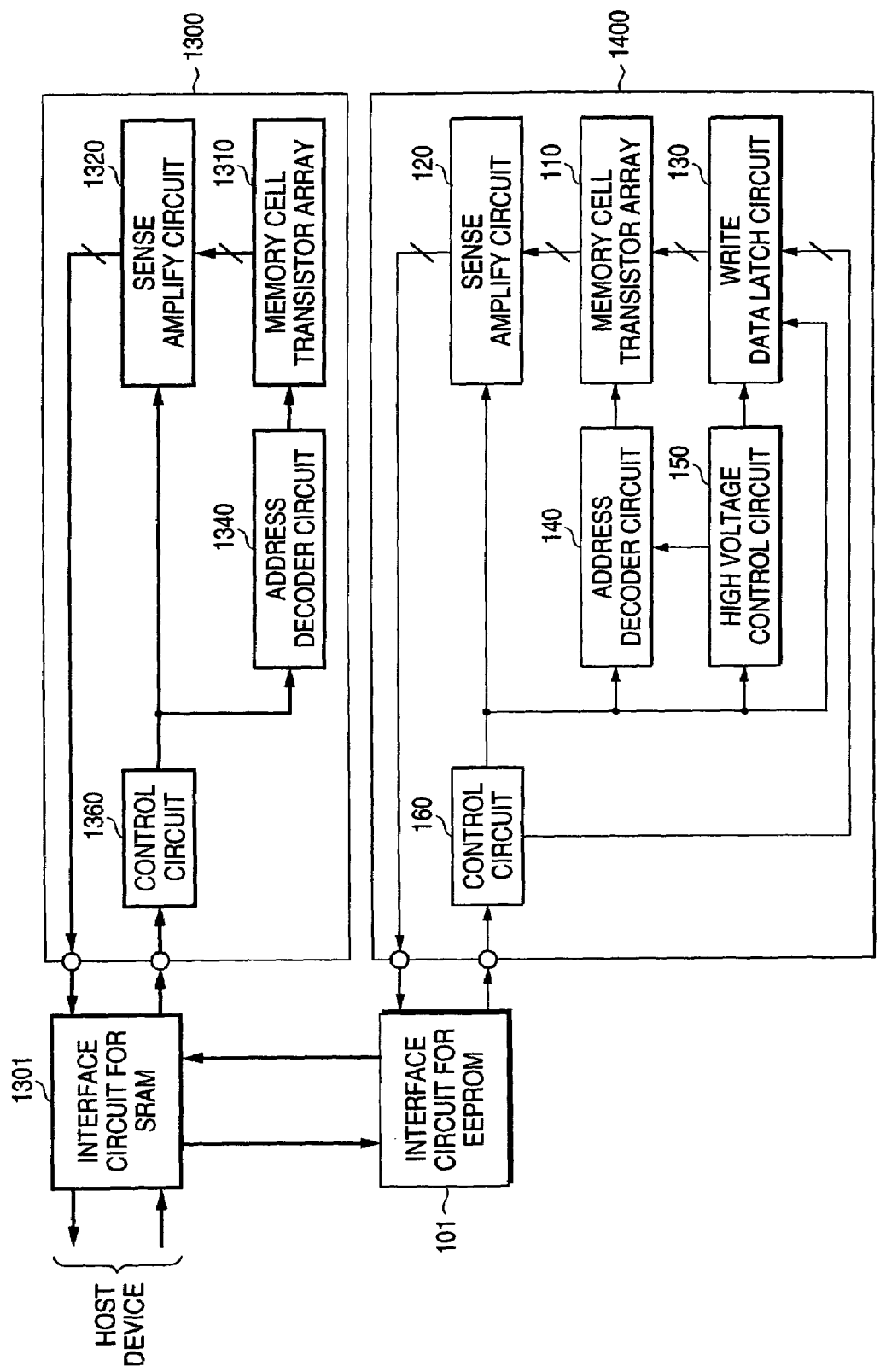
FIG. 23 is a block diagram of a usual semiconductor nonvolatile storage device.
Figure 24:
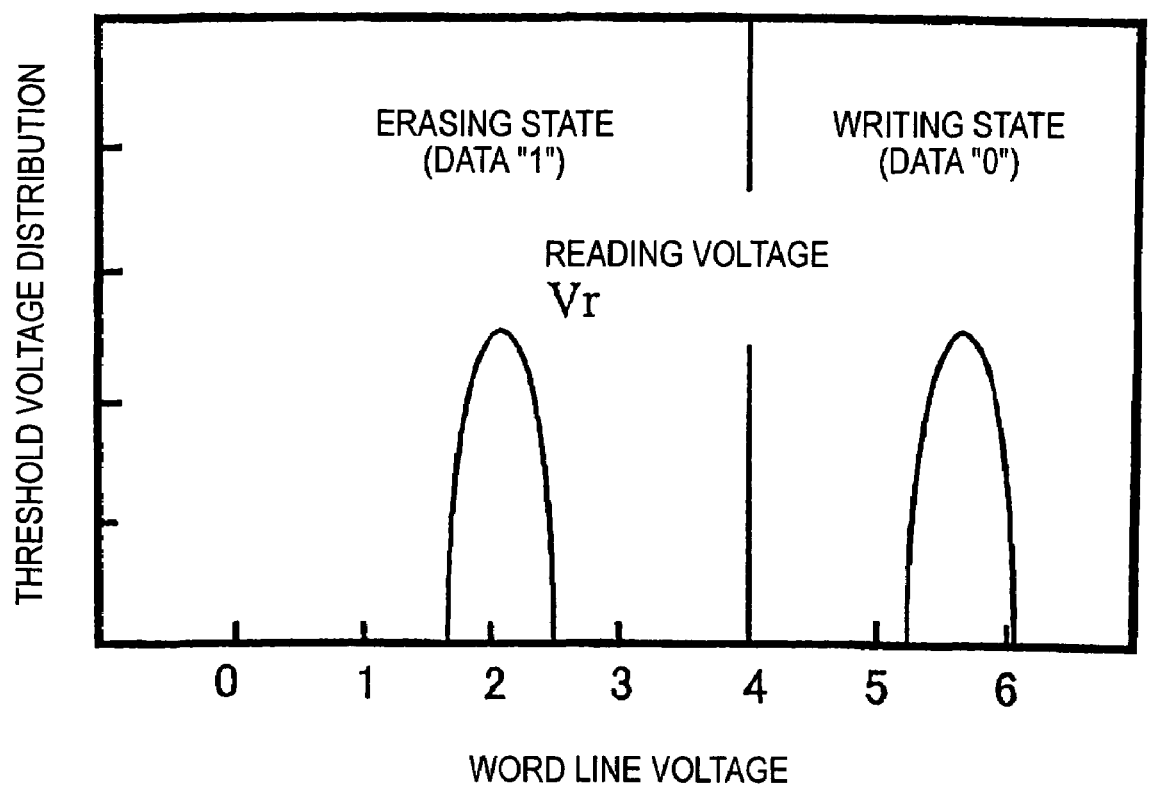
FIG. 24 shows a threshold voltage distribution in the usual semiconductor nonvolatile storage device.

In FIG. 1, components having the same functions as those of the above-described EEPROM shown in FIG. 23 are designated by the same reference numerals and the detailed explanation thereof is omitted. Here, only parts having different structures from those of the above-described EEPROM are described.

As shown in FIG. 1, an EEPROM 100 has a control circuit 160 in addition to a structure (110 to 150) similar to the above-described structure shown in FIG. 23. The control circuit 160 includes a writing operation selecting circuit 161 and a writing time control circuit 162.

Further, an output data switching circuit 170 and an input data switching circuit 180 are provided. The output of the output data switching circuit 170 is inputted to the input data switching circuit 180 through a write data transfer bus DB 106.

In the structure of a memory cell transistor, a source 4 and a drain 5 are formed in a board 6 as shown in FIG. 2A. Then, on a tunnel oxide film 3, a floating gate 2 is formed. Further, a control gate 1 is formed through an ONO (Oxide-Nitride-oxide) film 1a and a word line 8 is connected thereto. A high electric field is applied to the tunnel oxide film 3 to generate a tunnel current so that electrons accumulated on the floating gate 2 are drawn and injected. Thus, the threshold voltage of a memory cell is controlled to write and erase data.

Further, in a memory cell transistor array, memory cell transistor elements 7 are arranged at intersections of a plurality of word lines 8 and a plurality of bit lines 10 in the form of a matrix. Sources of the memory cell transistor elements 7 are respectively connected to source lines 9.

Now, a temporary writing operation in the EEPROM 100 will be described below.

The temporary writing operation is performed relative to the members 110 to 150 like a writing operation in the EEPROM in the related art.

At this time, in the temporary writing operation in this embodiment, the writing operation selecting circuit 161 selects the temporary writing operation for an input signal S100 of a writing instruction from a host device. Thus, the writing time control circuit 162 sets a writing time necessary at the minimum for normally performing an initial reading operation.

For instance, the writing time (tp) is 1 ms as shown in FIGS. 3A, 3B and 3C which is a time as short as one figure for an ordinary writing time (for instance, tp=10 ms) which considers an assured reliability.

High voltage necessary for writing data is controlled by a high voltage control circuit 150 receiving a control signal S101 of a writing operation and supplied to a write data latch circuit 130 and an address decoder circuit 140. Write data is held in the write data latch circuit 130 from data buses DB100 and DB101 through the input data switching circuit 180 and a write data bus DB102.

To addresses for writing data in the memory cell transistor array 110, the necessary high voltage is supplied from the write data latch circuit 130 and the address decoder circuit 140 for a time set by the writing time control circuit 162 to perform the temporary writing operation.

Now, an additional writing operation in this embodiment will be described below.

The additional writing operation is performed to the members 110 to 150 like reading and writing operations in the EEPROM in the related art.

At this time, in the additional writing operation according to this embodiment, for the input signals S100 of a data discriminating instruction, a data transfer instruction and a writing instruction from the host device, the control circuit 160 outputs the control signal S101 to each member. Thus, the additional writing operation composed of three stages of operations is performed, which includes a data discriminating operation for discriminating the temporarily written data in the memory cell transistor array 110 by a sense amplify circuit 120, a data transfer operation for transferring the data to the write data latch circuit 130 by the output data switching circuit 170 and the input data switching circuit 180 and a writing operation.

Now, the above-described data discriminating operation will be described. When the data of the memory cell transistor array 110 is discriminated by the sense amplify circuit 120, the difference between the current value of the memory cell transistor changing in accordance with the temporarily written data and a prescribed reference current (Iref) generated by a reference current control circuit 121 in the sense amplify circuit 120 is employed.

For instance, to the word line of the memory cell transistor selected by the address decoder circuit 140, 2V is applied through an address bus AB102. 1V is applied to a bit line DB103.

At this time, a drain current supplied between the bit line 10 and the source line 9 of the selected memory cell transistor is inputted to the sense amplify circuit 120 through a bit line DB104.

The above-described drain current is determined by the word line voltage, the bit line voltage and the threshold voltage or the like of the selected memory cell transistor. Output data from the sense amplify circuit 120 compares the prescribed reference current (for instance, Iref=20 μA) generated by the reference current control circuit 121 in the sense amplify circuit 120 with the drain current. When the quantity of drain current is larger than the reference current, the data becomes "1". When the quantity of drain current is smaller than the reference current, the data becomes "0".

Now, the data transfer operation will be described below.

The data outputted from the sense amplify circuit 120 by the data discriminating operation is inputted to and held in the write data latch circuit 130 through a read data transfer bus DB105, the output data switching circuit 170, the write data transfer bus DB106, the input data switching circuit 180 and the write data bus DB102.

In order to read out the temporarily written data and output the data outside the EEPROM 100, the control signal S101 is outputted from the control circuit 160 relative to the input signal S100 of a reading instruction from the host device. The data discriminating operation is performed in the same manner as described above. The output of the sense amplify circuit 120 is read through the read data transfer bus DB105, the output data switching circuit 170 and a data bus DB107.

Now, the writing operation will be described below.

The same operation as that described in the temporary writing operation is performed except that the writing operation is performed on the basis of the data held in the write data latch circuit 130 by the data transfer operation and the writing time set by the writing time control circuit 162 is set to a writing time longer than the writing time in the temporary writing operation and considering an assured ordinary reliability.

The above-described data discriminating operation, the data transfer operation and the writing operation are performed in accordance with the input signal S100 of the instruction from the host device, so that the data temporarily written in the memory cell transistor array 110 is additionally written.

According to the above-described operations, the temporary writing operation is performed for a writing time necessary at the minimum for normally performing the initial reading operation relative to the writing instruction to the EEPROM 100 from the host device. Then, the data temporarily written in the EEPROM 100 is additionally written. Accordingly, a semiconductor nonvolatile storage device capable of greatly reducing a time necessary for writing data in the EEPROM 100 from the host device can be obtained without extremely increasing a cost.

Second Embodiment

Now, a second embodiment of the present invention will be described below by referring to FIGS. 4 and 5.

Figure 4:
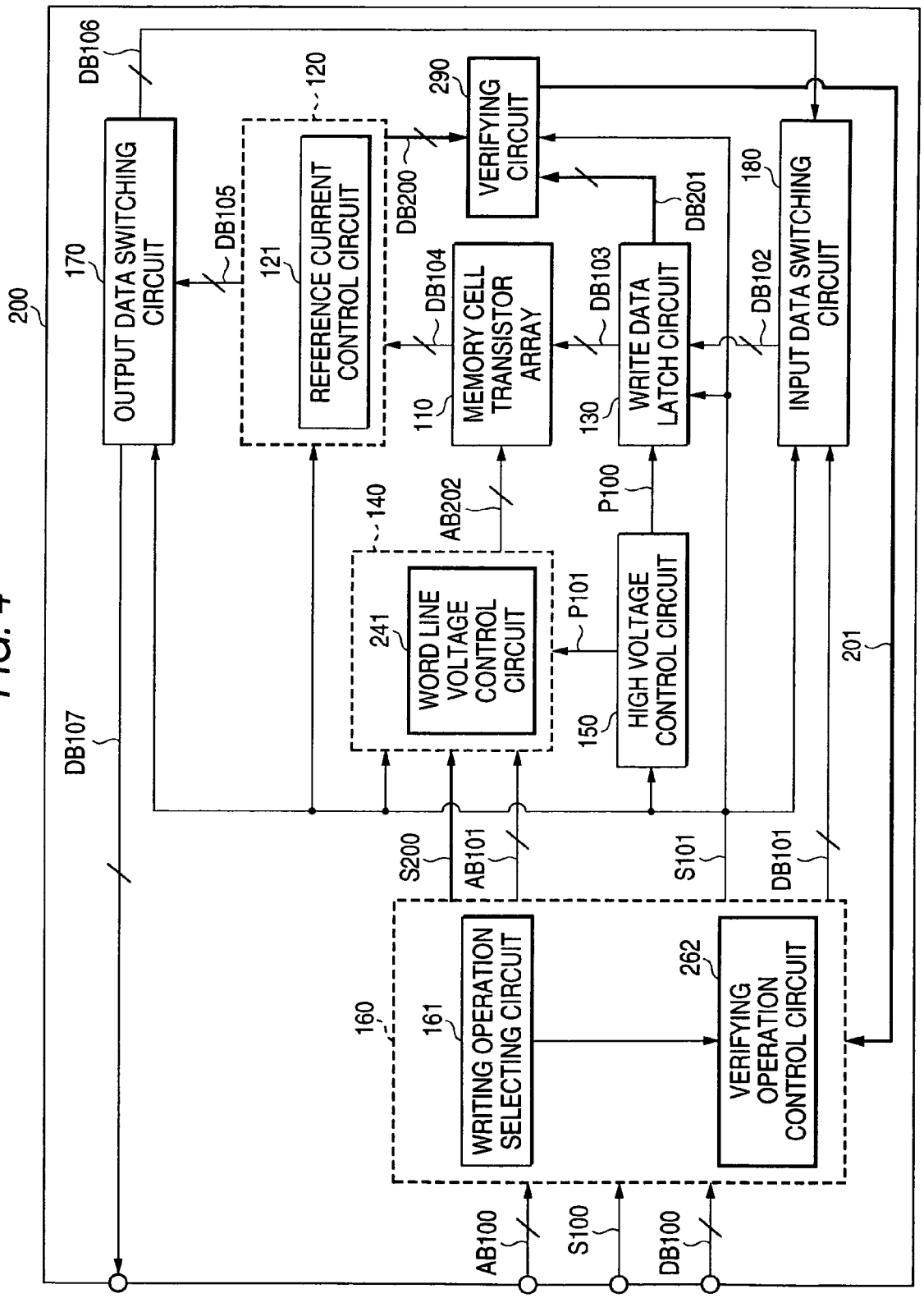
FIG. 4 is a block diagram of a semiconductor nonvolatile storage device according to a second embodiment.

FIG. 4 is a block diagram of an EEPROM according to a second embodiment.

Figure 5A:
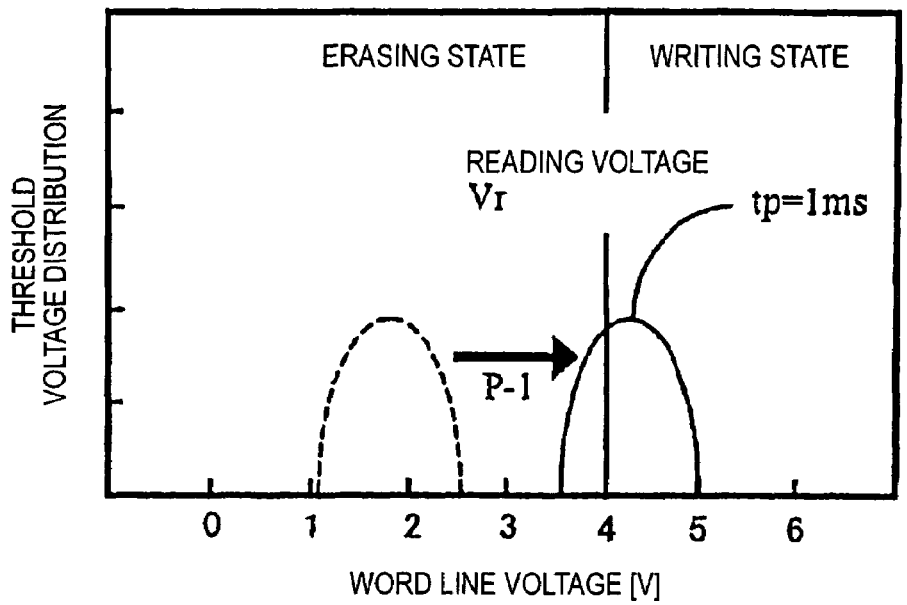
FIG. 5A shows a threshold voltage distribution and FIG. 5B shows a threshold voltage distribution in the second embodiment.
Figure 5B:
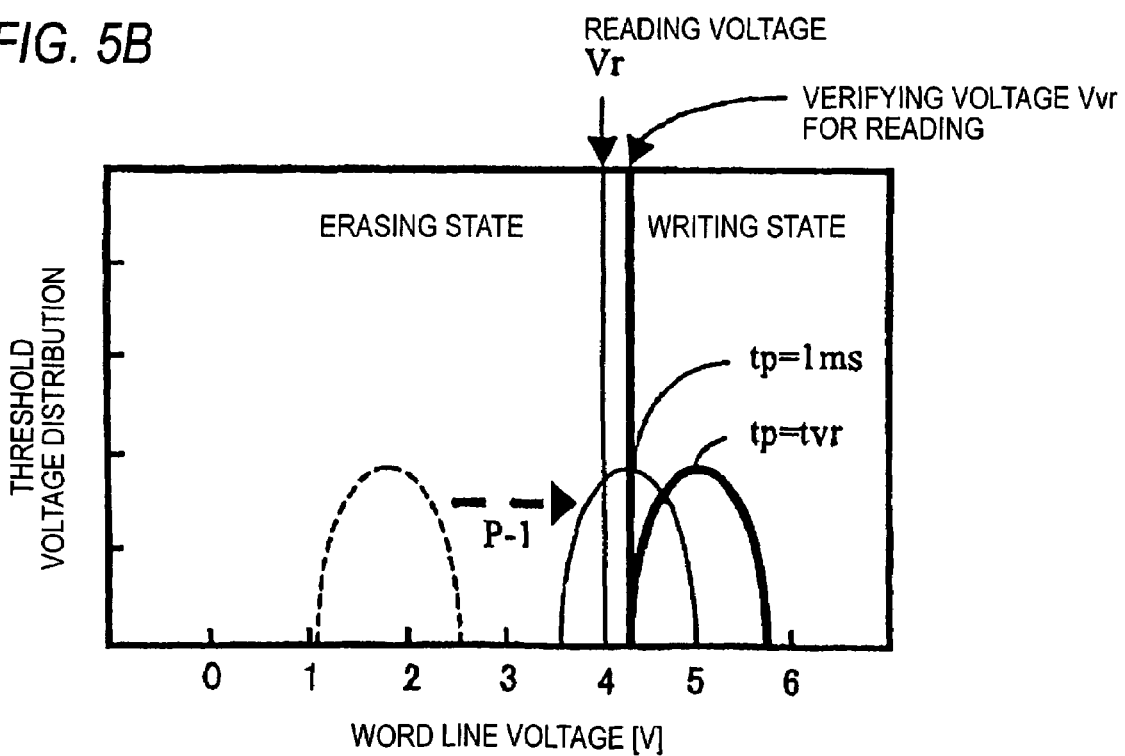

FIG. 5A is a view showing a threshold voltage distribution and FIG. 5B is a view showing a threshold voltage distribution (upon performing a verifying operation) according to the second embodiment.

As shown in FIG. 4, an EEPROM 200 includes a word line voltage control circuit 241, a verifying operation control circuit 262, a verifying circuit 290, a word line voltage control signal S200, a verifying decision result output signal S201 and verifying data buses DB200 and DB201 which are merely different from the first embodiment. The EEPROM 200 has the same structures as those designated by the same reference numerals and described in the first embodiment according to the present invention except the above-described components.

The threshold voltage of a memory cell transistor after the temporary writing operation is dependent on unevenness in writing characteristics due to unevenness in manufacture of the memory cell transistor or circuit characteristics. When writing time (for instance, tp=1 ms) in the temporary writing operation is fixed, the writing time needs to be determined by considering a case in which the depth of the threshold voltage after the writing operation is insufficient relative to reading voltage in the case of tp=1 ms as shown in FIG. 5A that takes the unevenness in manufacture into consideration.

Thus, the temporary writing time is set long in all products. Thus, in the present invention, a verifying operation is performed in the temporary writing operation to ensure the threshold voltage after the temporary writing operation for a time necessary at the minimum for each product.

Accordingly, the verifying operation control circuit is provided for controlling the verifying operation for discriminating whether or not the data is normally written in the memory cell transistor element by the temporary writing operation. The verifying circuit is provided for performing the verifying operation in accordance with the output signal of the verifying operation control circuit. Thus, unevenness in writing characteristics due to unevenness in manufacture of the memory cell transistor or circuit characteristics can be reduced. Further, the writing time in the temporary writing operation can be suppressed to a minimum as much as possible.

Third Embodiment

Now, a third embodiment according to the present invention will be described by referring to FIGS. 6 and 7.

Figure 6:
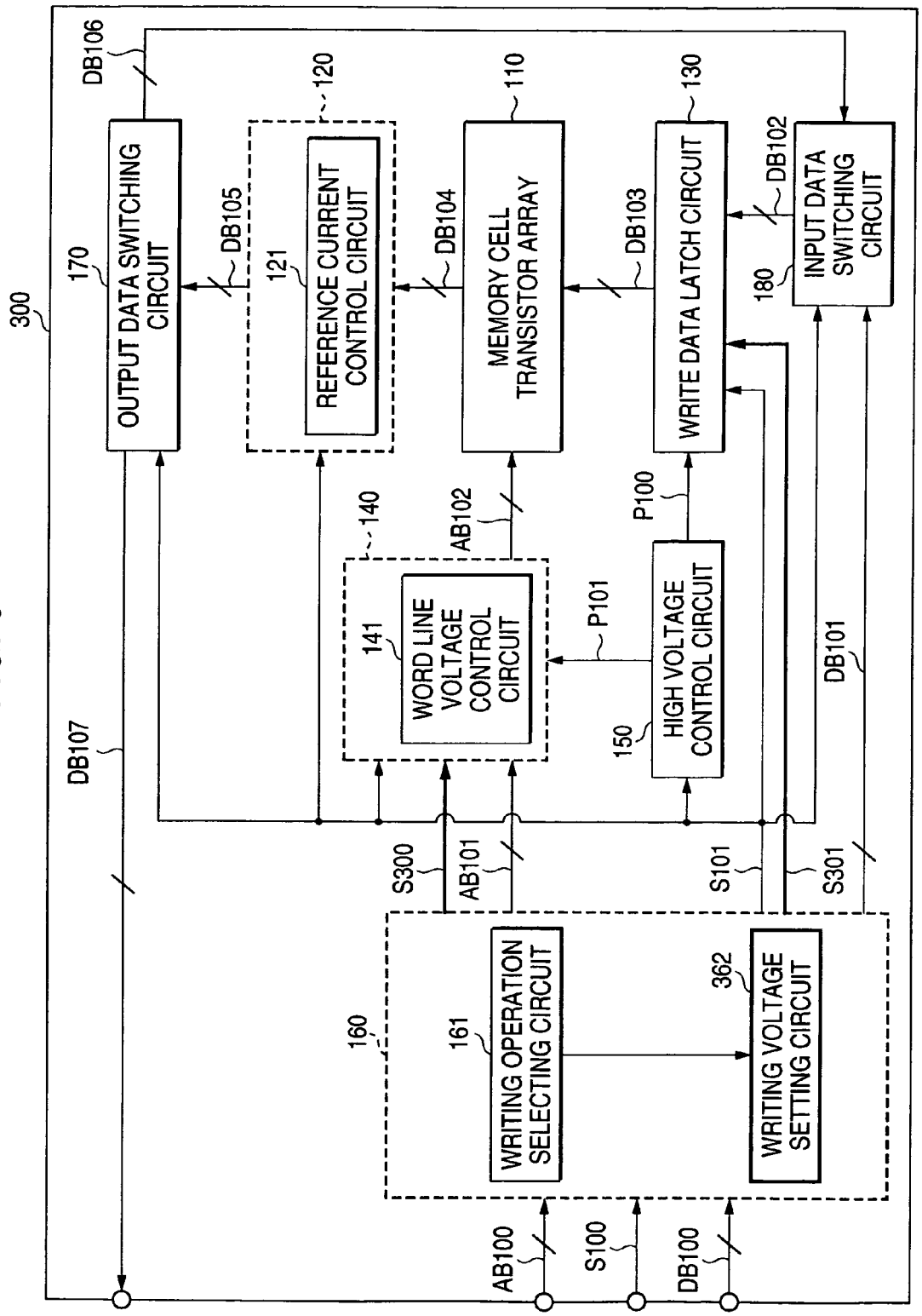
FIG. 6 is a block diagram of a semiconductor nonvolatile storage device according to a third embodiment.

FIG. 6 is a block diagram of an EEPROM according to the third embodiment.

Figure 7A:
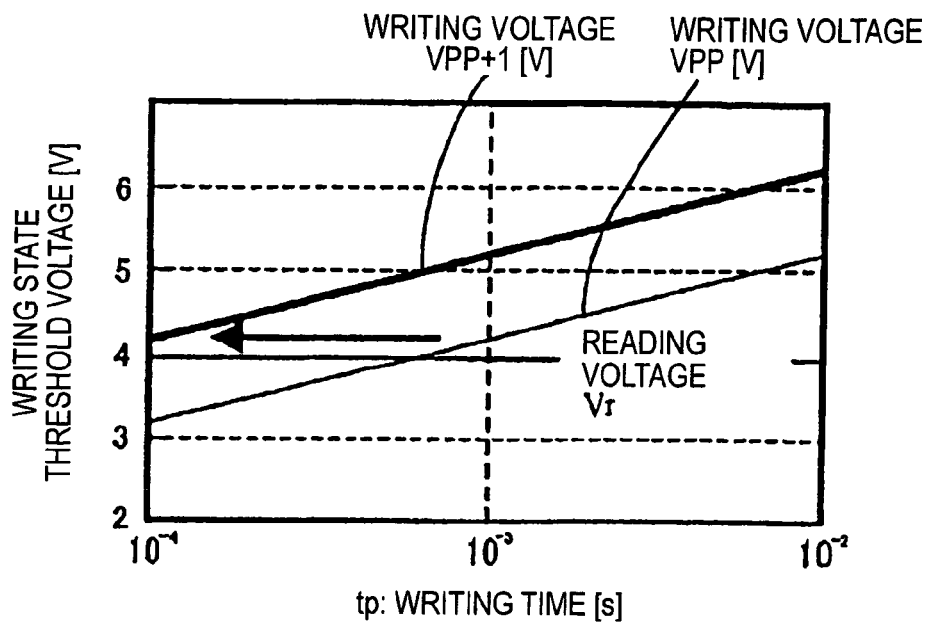
FIG. 7A is a view showing the dependence of writing state threshold voltage on writing time and on writing voltage.
Figure 7B:
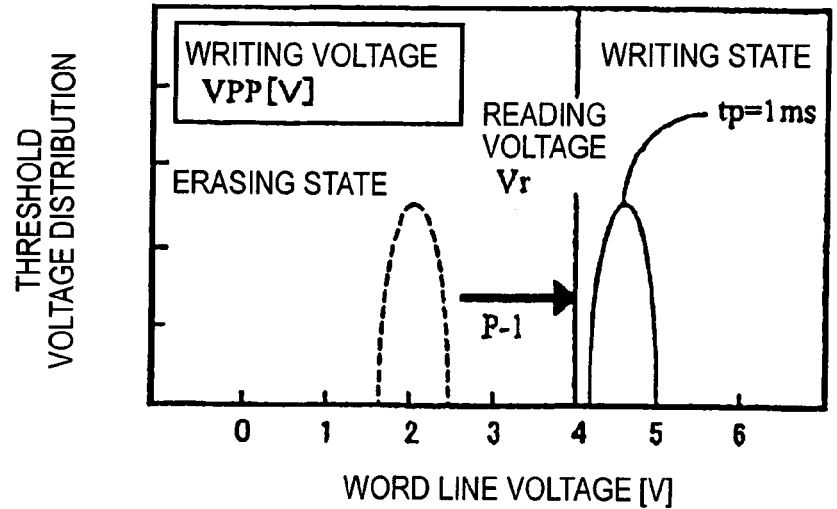
FIG. 7B shows a threshold voltage distribution and FIG. 7C is a view showing the dependence of memory cell current on word line voltage in the third embodiment.
Figure 7C:
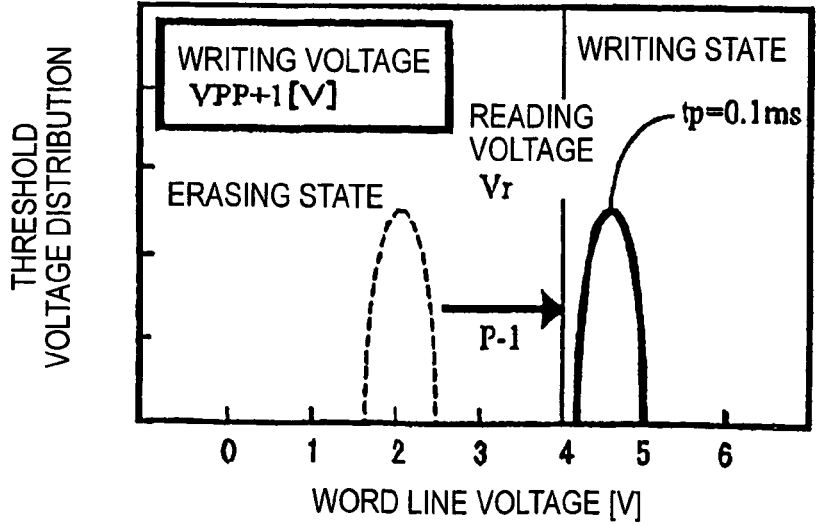

FIG. 7A is a view-showing the dependence of writing state threshold voltage on writing time and writing voltage, FIG. 7B shows a threshold voltage distribution and FIG. 7C is a view showing the dependence of memory cell current on word line voltage in the third embodiment.

As shown in FIG. 6, an EEPROM 300 includes a writing voltage setting circuit 362, a word line voltage control signal S300 and a bit line voltage control signal S301 which are merely different from the first embodiment of the present invention. The EEPROM has the same structures as those designated by the same reference numerals and described in the first embodiment of the present invention except the above-described components.

The writing voltage setting circuit 362 for controlling the set value of writing voltage by the output signal of the writing operation selecting circuit 161 is provided. Accordingly, the writing voltage in the temporary writing operation can be set higher than voltage in the additional writing operation. Thus, the writing time in the temporary writing operation can be shortened.

For example, assuming that high voltage for writing data upon additional writing operation is VPP [V] and high voltage for writing data upon temporary writing operation is VPP+1[V], when the target value of threshold voltage after the data is written is 4[V] which is the same as shown in FIG. 7A, the temporary writing operation of VPP+1[V] can reach 4[V] in the writing time shorter by one figure than that of the additional writing operation.

The high voltage for the temporary writing operation is raised. In this case, when the threshold voltage of a memory cell transistor which desires to hold data in an erased state is brought into a low writing state by the temporary writing operation, the temporary writing operation is performed to discriminate the data written in the memory cell transistor element and the discriminated data is transferred to the write data holding circuit for the additional writing operation. After an erasing operation is performed for a writing block in a memory cell transistor array for performing the additional writing operation, the additional writing operation is performed. Thus, the reliability of erased data and write data can be ensured.

Fourth Embodiment

Now, a fourth embodiment according to the present invention will be described by referring to FIGS. 8 and 9.

Figure 8:
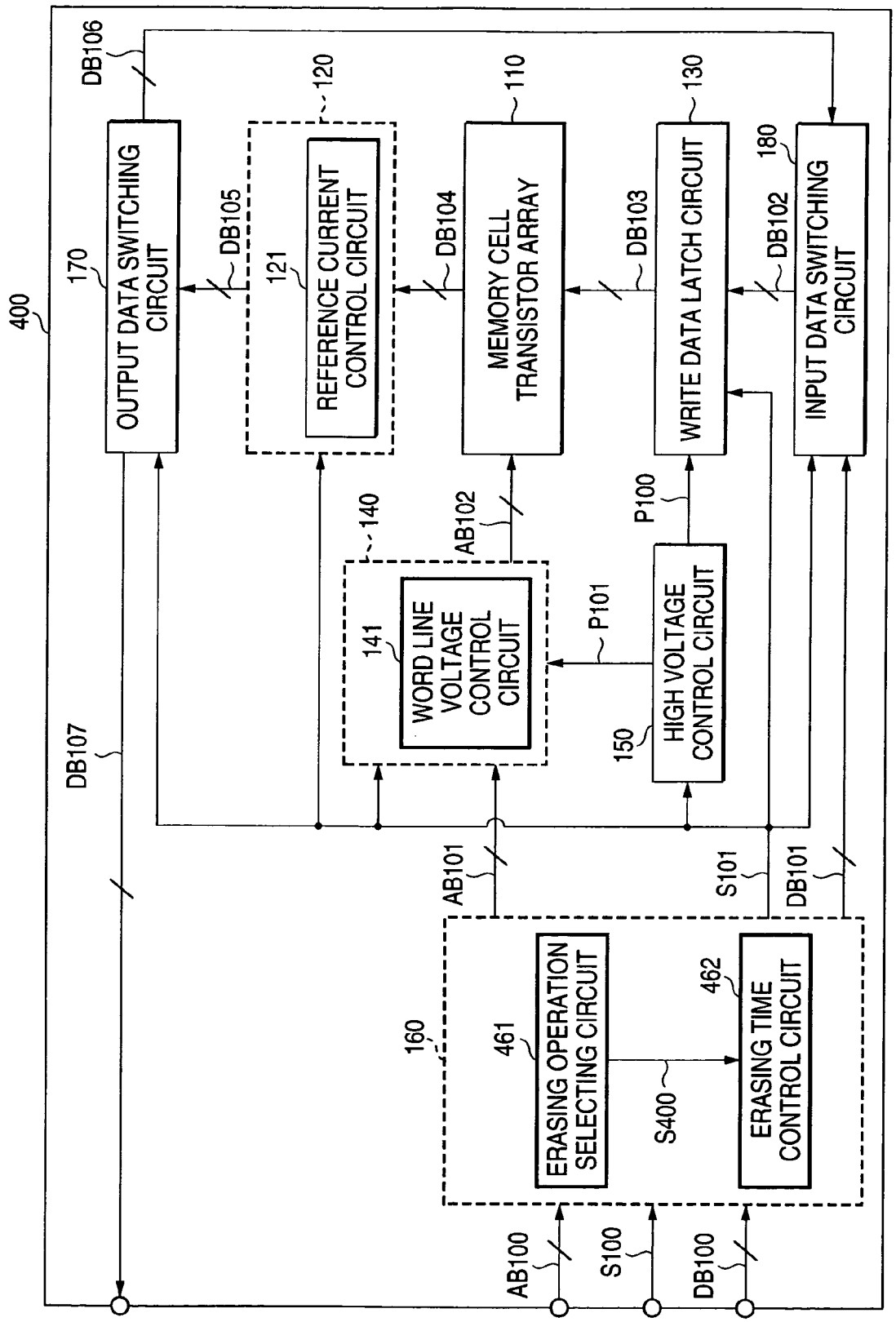
FIG. 8 is a block diagram of a semiconductor nonvolatile storage device according a fourth embodiment.

FIG. 8 is a block diagram of an EEPROM according to the fourth embodiment.

Figure 9:
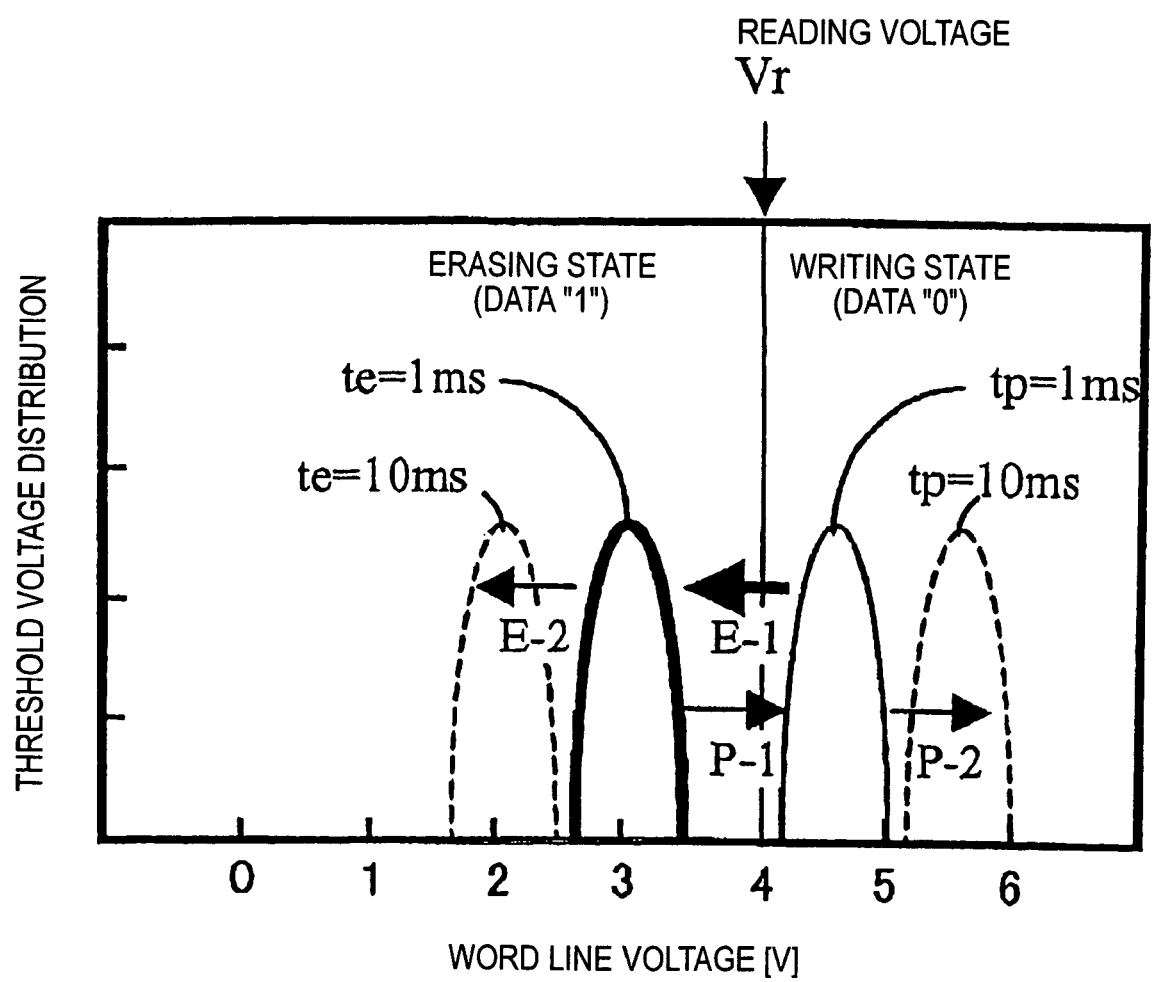
FIG. 9 shows a threshold voltage distribution according to the fourth embodiment.

FIG. 9 is a view showing a threshold voltage distribution according to the fourth embodiment.

As shown in FIG. 8, an EEPROM 400 includes an erasing operation selecting circuit 461, an erasing time control circuit 462 and an erasing operation selecting signal S400 which are merely different from the first embodiment of the present invention. The EEPROM has the same structures as those of other members than the above-described members designated by the same reference numerals and described in the first embodiment of the present invention.

The erasing operation selecting circuit 461 is provided for selecting a primary erasing operation having a prescribed erasing time for the memory cell transistor element and a secondary erasing operation having an erasing time longer than that of the primary erasing operation. The erasing time control circuit 462 is provided for controlling the erasing time in accordance with the output signal of the erasing operation selecting circuit. Thus, only the primary erasing operation and the temporary writing operation necessary at the minimum for the normal operation of an initial reading operation are temporarily carried out for a writing instruction from the host device to shorten the erasing time and the writing time. After that, the temporarily written data written in the EEPROM 400 is transferred to a write data latch circuit by using a sense amplify circuit, and then, the secondary erasing operation and the additional writing operation necessary for ensuring a reliability are performed on the basis of the data of the write data latch circuit. Thus, the reliability can be ensured.

Fifth Embodiment

Now, a fifth embodiment according to the present invention will be described by referring to FIGS. 10 and 11.

Figure 10:
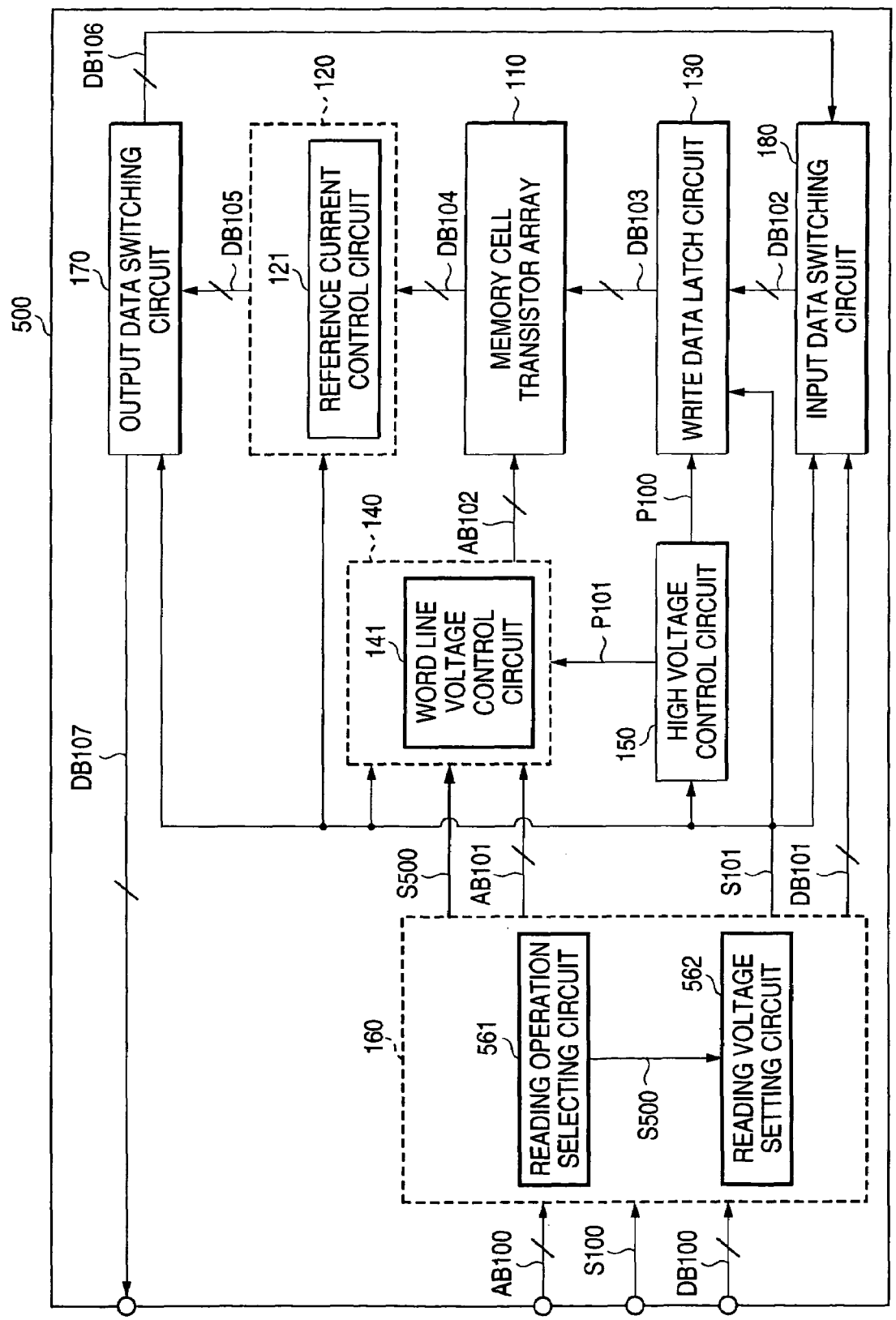
FIG. 10 is a block diagram of a semiconductor nonvolatile storage device according to a fifth embodiment.

FIG. 10 is a block diagram of an EEPROM according to the fifth embodiment.

Figure 11A:
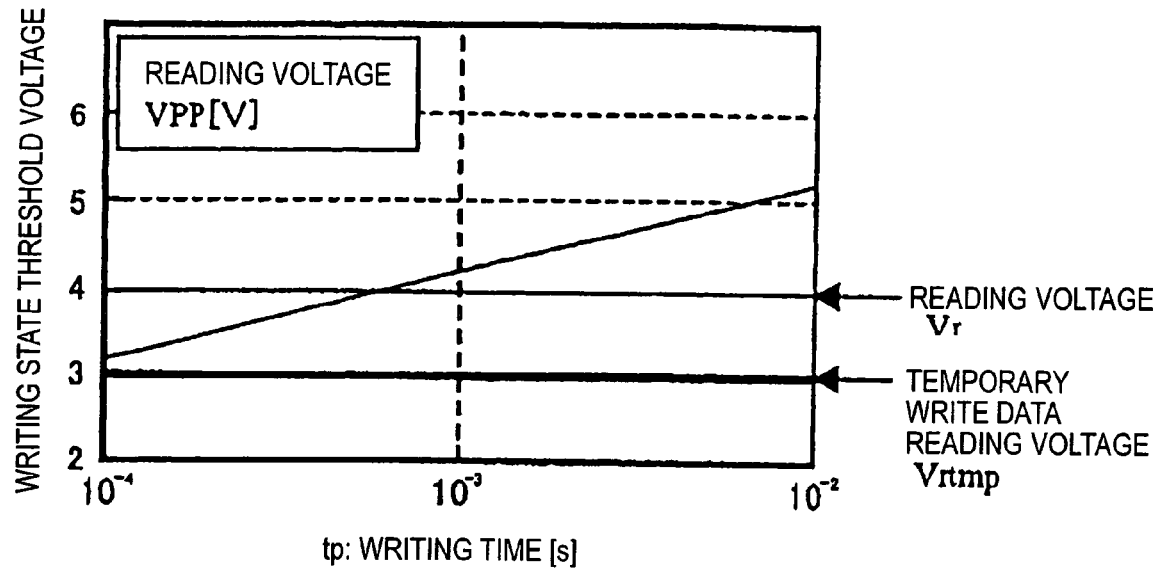
FIG. 11A is a view showing the dependence of writing state threshold voltage on writing time and FIG. 11B shows a threshold voltage distribution in the fifth embodiment.
Figure 11B:
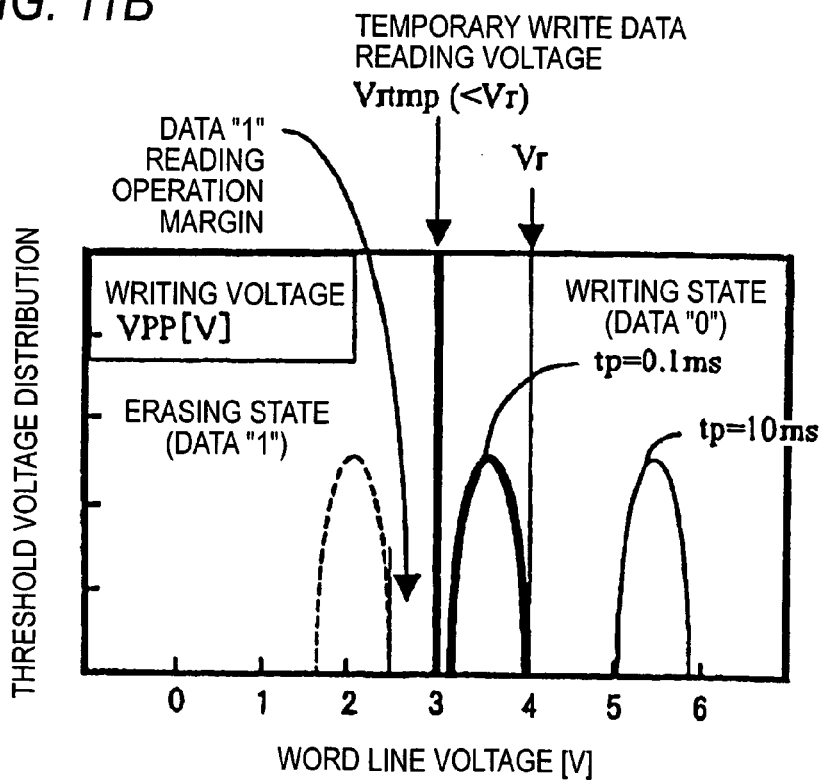

FIG. 11A is a view showing the dependence of writing state threshold voltage on writing time and FIG. 11B shows a threshold voltage distribution in the fifth embodiment.

As shown in FIG. 10, an EEPROM 500 includes a reading operation selecting circuit 561, a reading voltage setting circuit 562 and a word line voltage control signal S500 which are merely different from the first embodiment of the present invention. The EEPROM has the same structures as those of other members than the above-described members designated by the same reference numerals and described in the first embodiment of the present invention.

The reading operation selecting circuit 561 is provided which can select a reading operation of the temporarily written data and a reading operation of the additionally written data. Further, the reading voltage setting circuit 562 is provided in which the set value of word line voltage upon reading data is set to temporarily written data reading voltage (Vrtmp) in accordance with an output signal of the reading operation selecting circuit, when the output signal indicates the temporary reading operation, and, the set value of the word line voltage is set to reading voltage (Vr) when the output signal indicates the additional reading operation. Thus, when the threshold voltage of the memory cell transistor after the writing operation of data is higher than the threshold voltage of the memory cell transistor after the erasing operation of data, the reading voltage (for instance, Vrtmp=3[V]) of the temporarily written data is set to voltage lower than the reading voltage (Vr=4[V]). Even when the threshold voltage of the memory cell transistor after the writing operation of data is low, the data can be precisely discriminated and the writing time can be shortened.

Vrtmp is lower than Vr. Thus, when the temporarily written data is read by using the reading voltage Vrtmp of the temporarily written data, voltage lower than word line voltage upon reading operation of additionally written data may be supplied to a word line AB102 from a word line voltage control circuit 141. The reading operation of the temporarily written data may be performed with power consumption lower than that of the reading operation of the additionally written data.

Sixth Embodiment

Now, a sixth embodiment according to the present invention will be described by referring to FIGS. 12, 13 and 14.

Figure 12:
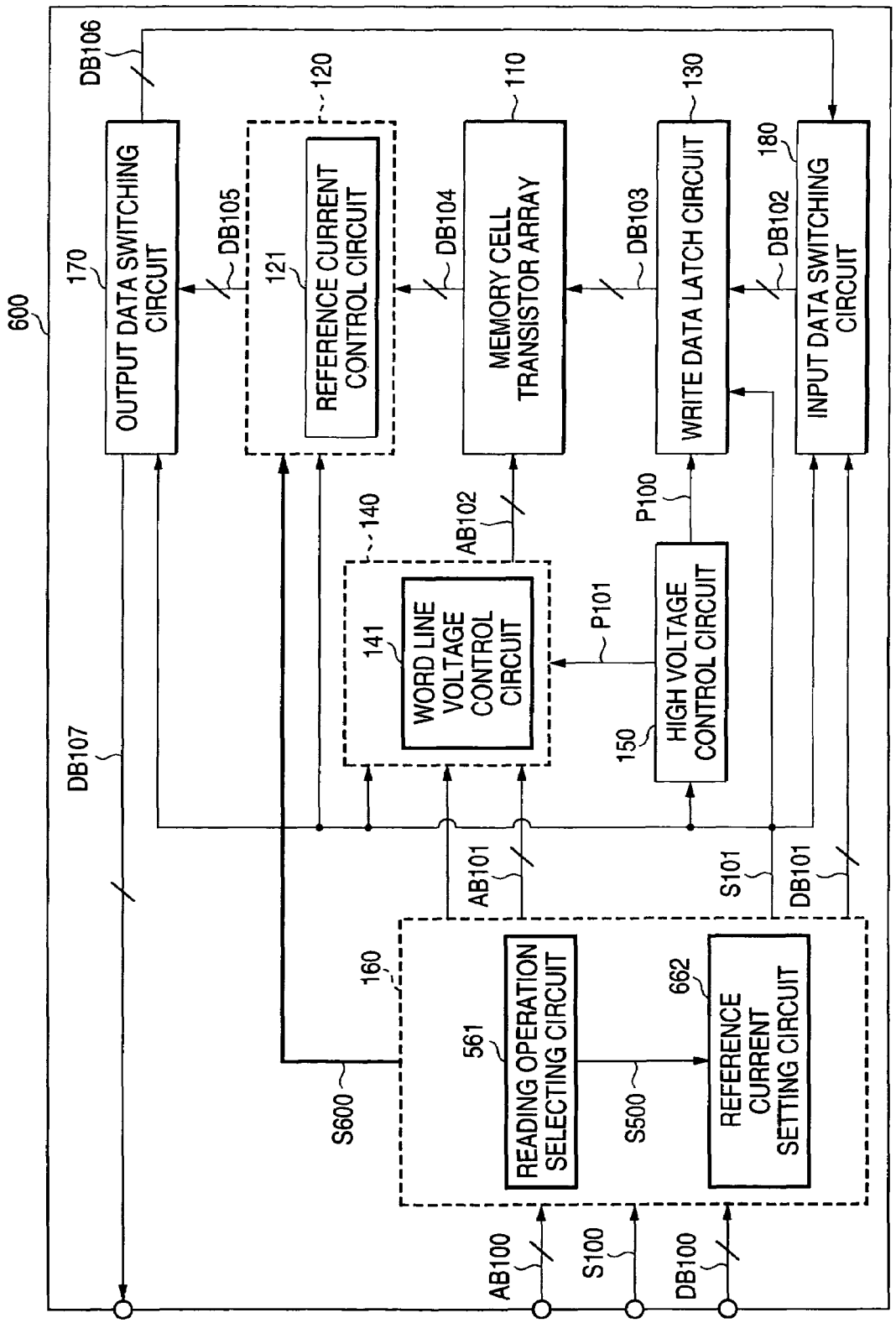
FIG. 12 is a block diagram of a semiconductor nonvolatile storage device according to a sixth embodiment.
Figure 13A:
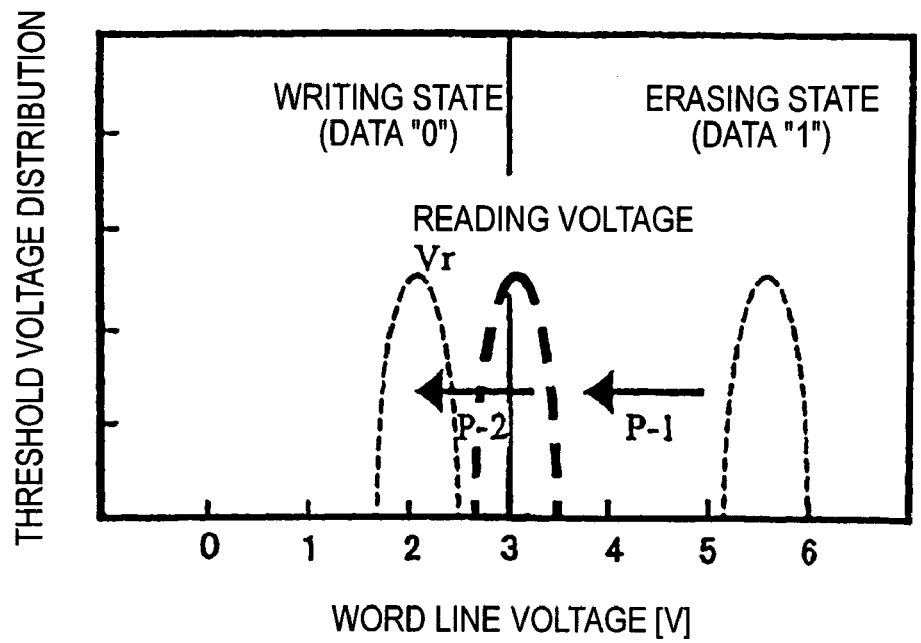
FIG. 13A shows a threshold voltage distribution and FIG. 13B is a view showing the dependence of writing state threshold voltage on writing time and on writing voltage in the sixth embodiment.
Figure 13B:
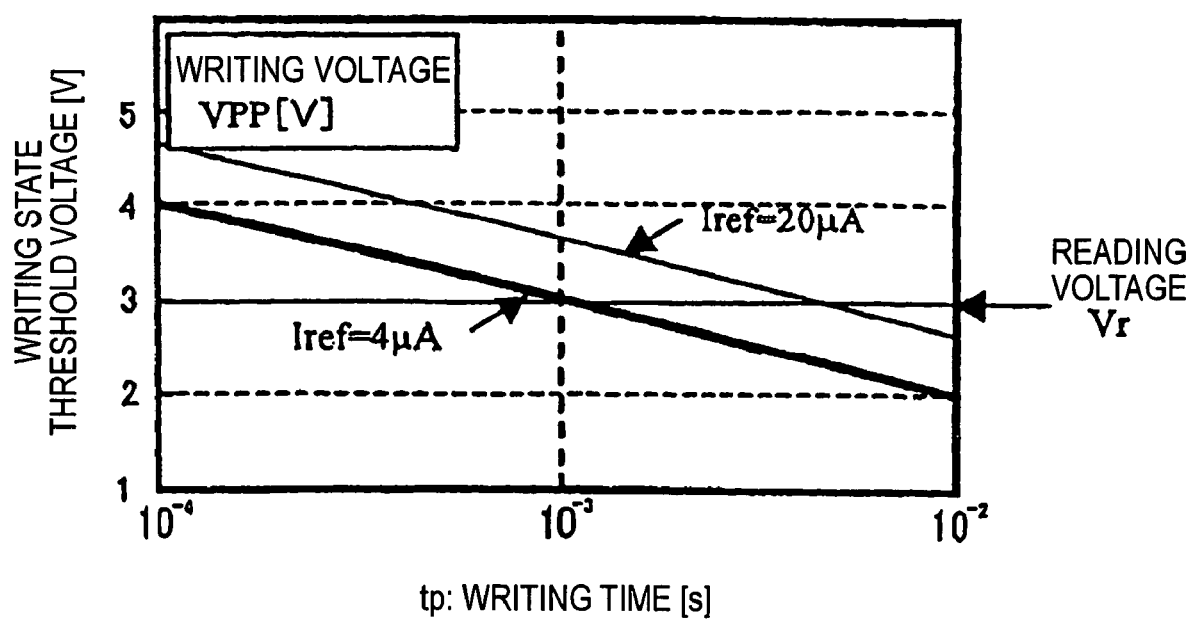

FIG. 12 is a block diagram of an EEPROM according to the sixth embodiment,

FIG. 13A shows a threshold voltage distribution and FIG. 13B is a view showing the dependence of writing state threshold voltage on writing time and on writing voltage in the sixth embodiment.

Figure 14A:
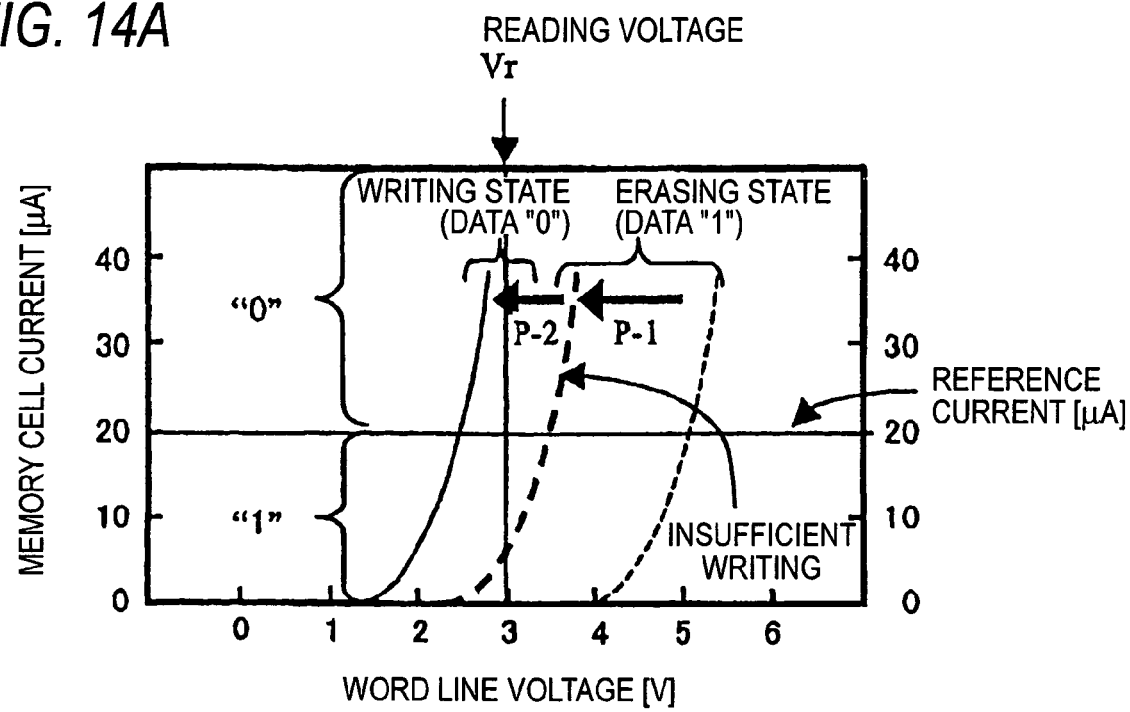
FIG. 14A is a view showing the dependence of memory cell current on word line voltage and FIG. 14B is a view showing the dependence of memory cell current on word line voltage in the sixth embodiment.
Figure 14B:
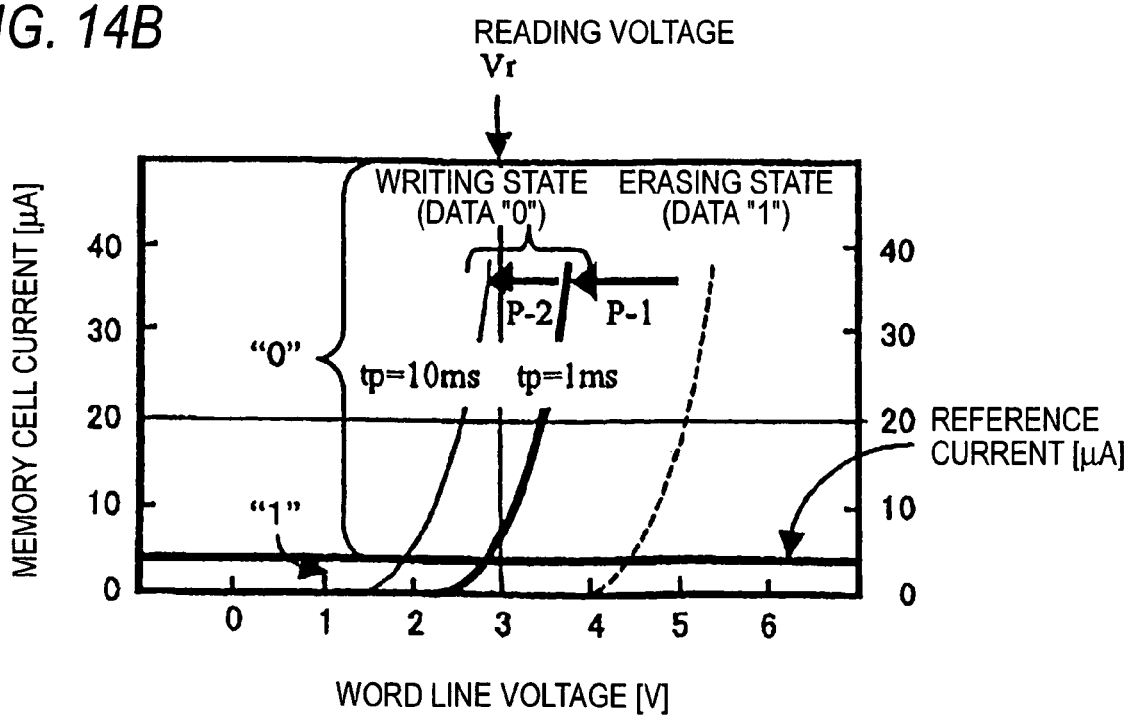

FIG. 14A is a view showing the dependence of memory cell current on word line voltage and FIG. 14B is a view showing the dependence of memory cell current on word line voltage in the sixth embodiment.

As shown in FIG. 12, an EEPROM 600 includes a reference current setting circuit 662 and a reference current setting signal S600 which are merely different from the first embodiment or the fifth embodiment of the present invention. The EEPROM has the same structures as those of other members than the above-described members designated by the same reference numerals and described in the first embodiment or the fifth embodiment of the present invention.

The threshold voltage of the memory cell transistor after the data is written is lower than the threshold voltage of the memory cell transistor after the data is erased. In this case, if the Vrtmp is allowed to be higher than the Vr correspondingly to the low threshold voltage after the data is lightly written as in the case of the fifth embodiment, when the temporarily written data is read using the reading voltage Vrtmp for the temporarily written data, voltage higher than word line voltage upon reading operation of the additionally written data needs to be supplied to a word line AB102 from a word line voltage control circuit 141. Thus, the reading operation of the temporarily written data needs consumed power more than that of the reading operation of the additionally written data.

Accordingly, the reference current setting circuit 662 is provided for allowing reference current as a decision reference of electric current to flow to the memory cell transistor when read data is decided and controlling the set value of the reference current upon reading data in accordance with the output signal of a reading operation selecting circuit 561. Thus, when the threshold voltage of the memory cell transistor after the data is written is lower than the threshold voltage of the memory cell transistor after the data is erased, the reference current upon reading the temporarily written data is set lower than the reference current upon reading the additionally written data. Thus, even when the threshold voltage of the memory cell transistor after the data is written is low, as shown in FIG. 14B, the data can be correctly discriminated, so that the writing time can be shortened.

Seventh Embodiment

Now, a seventh embodiment of the present invention will be described by referring to FIGS. 15, 16 and 17.

Figure 15:
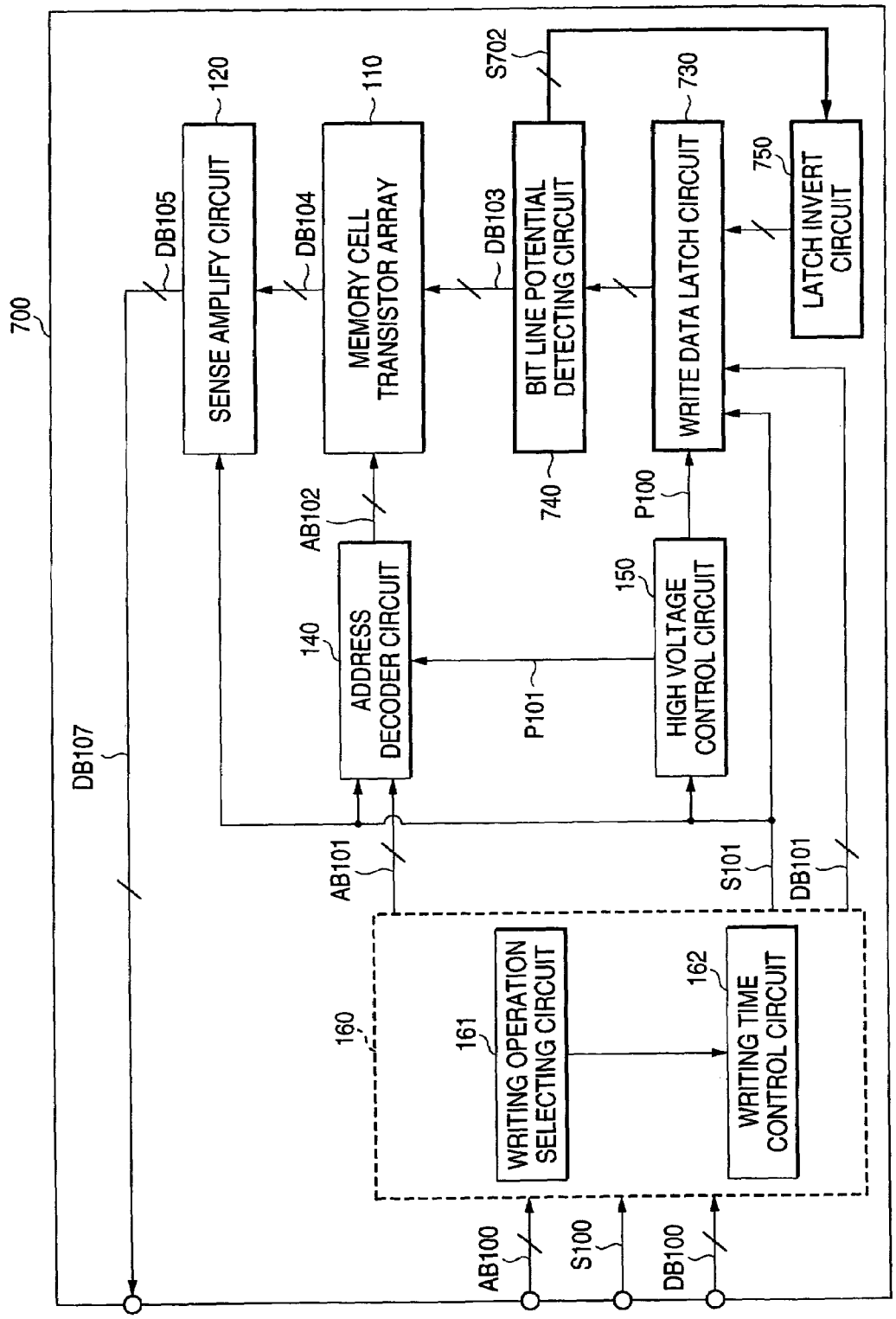
FIG. 15 is a block diagram of a semiconductor nonvolatile storage device according to a seventh embodiment.

FIG. 15 is a block diagram of an EEPROM according to the seventh embodiment.

As shown in FIG. 15, an EEPROM 700 includes a write data latch circuit 730, a bit line potential detecting circuit 740, a latch invert circuit 750 and a latch invert signal S702.

Figure 16:
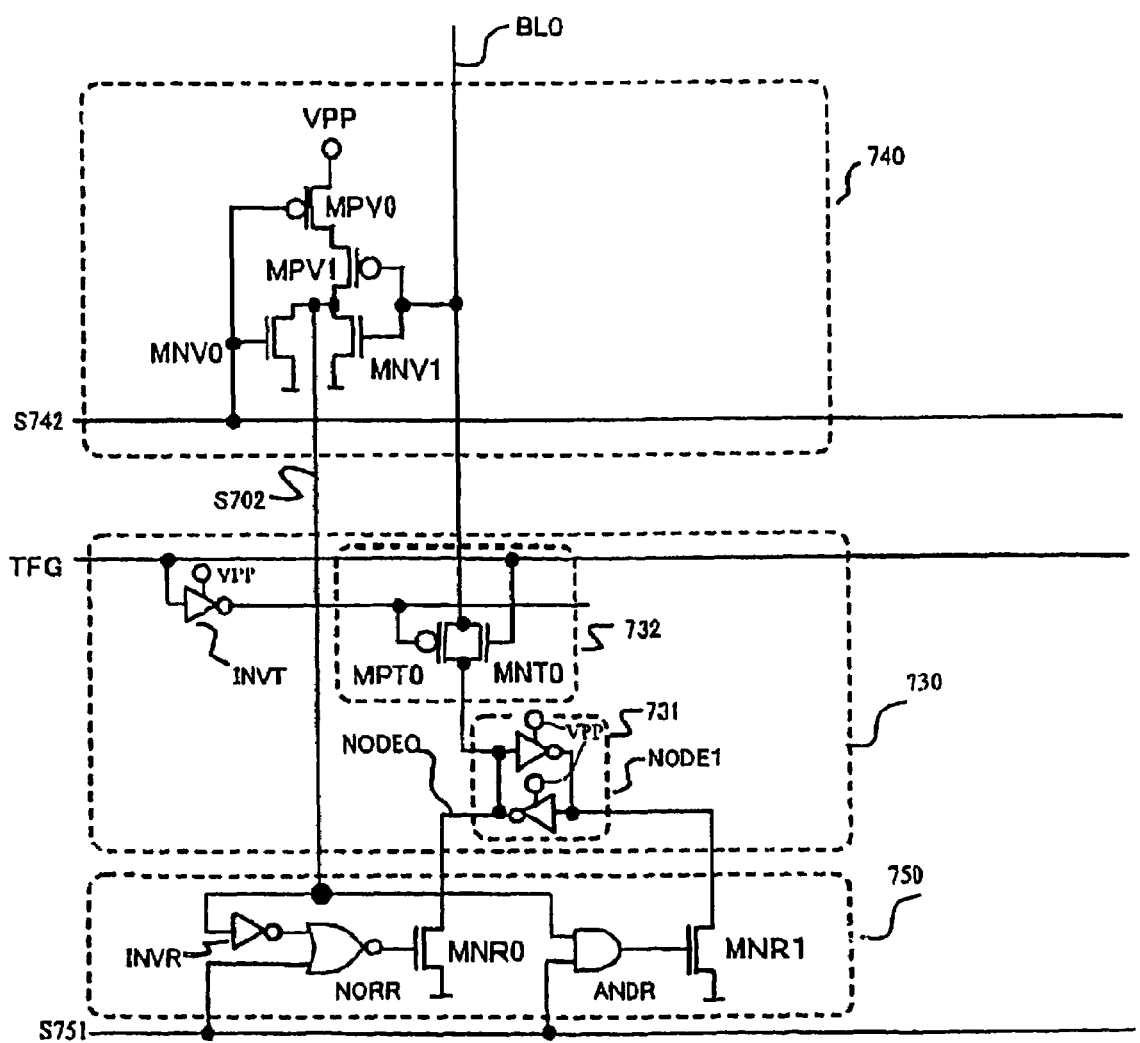
FIG. 16 is a circuit diagram showing the structures of a write data latch circuit, a bit line potential detecting circuit and a latch invert circuit of the semiconductor nonvolatile storage device according to the seventh embodiment.

FIG. 16 is a circuit diagram showing the structures of the write data latch circuit 730, the bit line potential detecting circuit 740 and the latch invert circuit 750 of the EEPROM 700.

As shown in FIG. 16, the write data latch circuit 730 of the EEPROM 700 includes a latch 731, a transfer gate 732 for electrically separating a bit line BL0 from the latch 731 and an inverter INVT for driving a Pch transistor MPT0 forming the transfer gate 732.

The bit line potential detecting circuit 740 has a logic of NOR with one input connected to the bit line BL0 and the other input connected to a control signal S742. When the control signal S742 is set to "L" and the potential of the bit line BL0 is lower than the invert point of the bit line potential detecting circuit, "H" is outputted to the latch invert signal S702.

The latch invert circuit 750 includes a transistor MNR0 for connecting the node NODE0 of the latch 731 to the ground, a transistor MNR1 for connecting a node NODE1 to the ground and an inverter INVR, a NOR gate NORR and an AND gate ANDR for controlling these transistors by a data transfer signal S751 and the latch invert signal S702.

Now, the operation of the above-described EEPROM 700 will be described. Since the operation of the EEPROM 700 is the same as that of the EEPROM 100 of the first embodiment except a program and program verifying operation and a data transfer operation, the program verifying operation and the data transfer operation will be described hereinafter.

Firstly, the program operation and the program verifying operation will be described by referring to FIG. 16. In the program operation, program data is firstly set in the latch 731.

The NODE0 of the latch connected to a memory cell for executing the program holds a state of an "H" level. The NODE0 of the latch connected to a memory cell that is not programmed holds a state of an "L" level. To program the memory cell, voltage of VPP is firstly set to program voltage. Then, the control signal TFG of the transfer gate is activated to electrically connect the bit line BL0 to the latch 731. The word line of the memory cell selected at the same timing as this operation is selected.

Here, when the data of the latch 731 is in a state of "H", the program voltage is supplied to the bit line BL0 connected thereto and the program is performed relative to the selected memory cell. When the data of the latch 731 is in a state of "L", the potential of the bit line BL0 becomes 0V. Accordingly, the program is not executed in the selected memory cell.

Now, the program verifying operation will be described below.

Here, a case in which a memory cell in an erased state is high in threshold voltage and a memory cell in a written state is low in threshold voltage is described as an example.

In the program verifying operation, the data transfer signal S751 is fixed to "L" and the voltage level of VPP is set to VDD as verifying voltage. Then, the transfer gate 732 is made active to pre-charge only a bit line composed of bits in which "H" is held in the latch 731 to the VDD.

When the pre-charging operation is completed, the transfer gate is made inactive and the program verifying voltage is applied to the word line of the selected memory cell. At this time, when the program of the memory cell is properly executed, memory cell current is allowed to slightly flow to discharge the electric charge of the pre-charged bit line.

When the control signal S742 of the bit line potential detecting circuit is set to "L" after the memory cell current is allowed to flow for a prescribed period, the potential of the bit line BL0 exceeds the invert point of the bit line potential detecting circuit 740. Thus, the latch invert signal S702 is brought into a state of "H". Since the data transfer signal S751 is in a state of "L", the transistor MNR0 is turned on, the NODE0 is connected to the ground and the latch 731 held in the state of "H" is rewritten to "L".

When the program is not properly performed, the current is not supplied to the bit line and the data of the latch is not rewritten. When the data of the latch is rewritten, the state of "L" is held and the program voltage and the program verifying voltage are not subsequently applied to the bit line.

At this time, when the voltage of the selected word line is set to two kinds of voltages including temporary writing verifying word line voltage and additional writing verifying word line voltage. Thus, a temporary writing verifying operation and an additional writing verifying operation can be realized in the same circuit.

Figure 17:
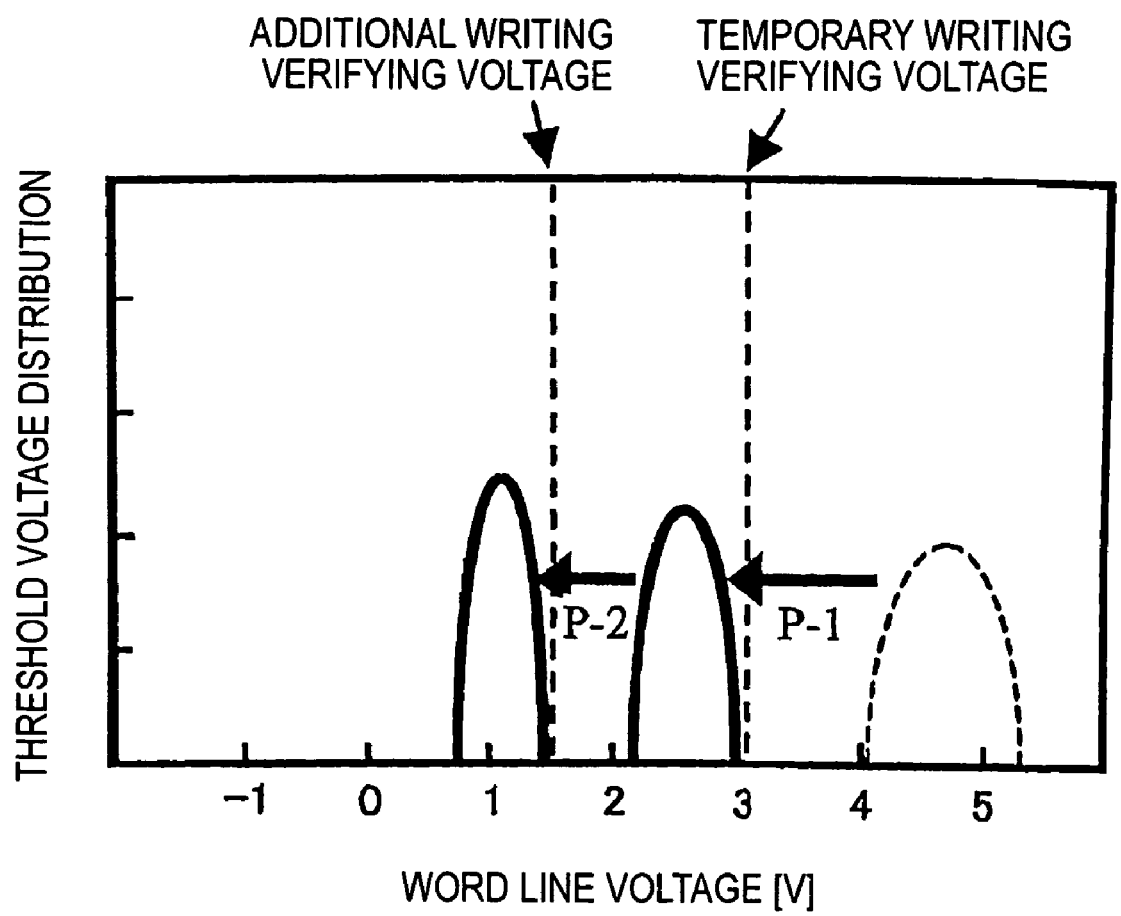
FIG. 17 shows a threshold voltage distribution according to the seventh embodiment.

For example, if the temporary writing verifying word line voltage is set to 3.0 V and the additional writing verifying word line voltage is set to 1.5 v, the threshold voltage distribution of the memory cell as shown in FIG. 17 is obtained.

Now, the data transfer operation will be described below. When the data is transferred, the data transfer signal S751 is set to "H". Initially, all latches (NODE0) are set to "L".

Then, the voltage of the selected word line is set to the temporary writing verifying word line voltage to pre-charge all bit lines to VDD. Then, the same operation as the program verifying operation is performed.

When the memory cell is in the temporarily written state, the latch invert signal S702 of the output of the bit line potential detecting circuit 740 is brought into a state of "H", the transistor MNR1 is turned on, the NODE1 is set to "L" and the NODE0 is set to "H". When the memory cell is in the erased state, the latch invert signal S702 is brought into a state of "L" and L is held in the NODE0. In such a way, the data transfer operation is completed.

As described above, according to this embodiment, the bit line potential detecting circuit 740 and the latch invert circuit 750 are provided for each bit line. Accordingly, the program verifying operation and the data transfer operation can be simultaneously carried out relative to all memory cells selected by word lines. Therefore, the program verifying operation and the data transfer operation can be performed at high speed.

For example, in the case of a structure that the width of a bus of the data bus DB107 is 32 bits, the number of the sense amplify circuits 120 is 32, the number of the bit lines is 1024 and one sense amplifier is provided at intervals of 16 bit lines, time necessary for a data transfer operation is shortened to ⅓₂ as long as time necessary for transferring data by using the sense amplifier.

Further, since the sense amplifier is designed so that the data bus DB107 of a high load can be driven at high speed, consumed current upon operation is increased. The bit line potential detecting circuit 740 drives only the latch invert circuit 750 so that consumed current upon transferring the data can be greatly reduced.

Eighth Embodiment

Now, an eighth embodiment of the present invention will be described by referring to FIG. 18.

Figure 18:
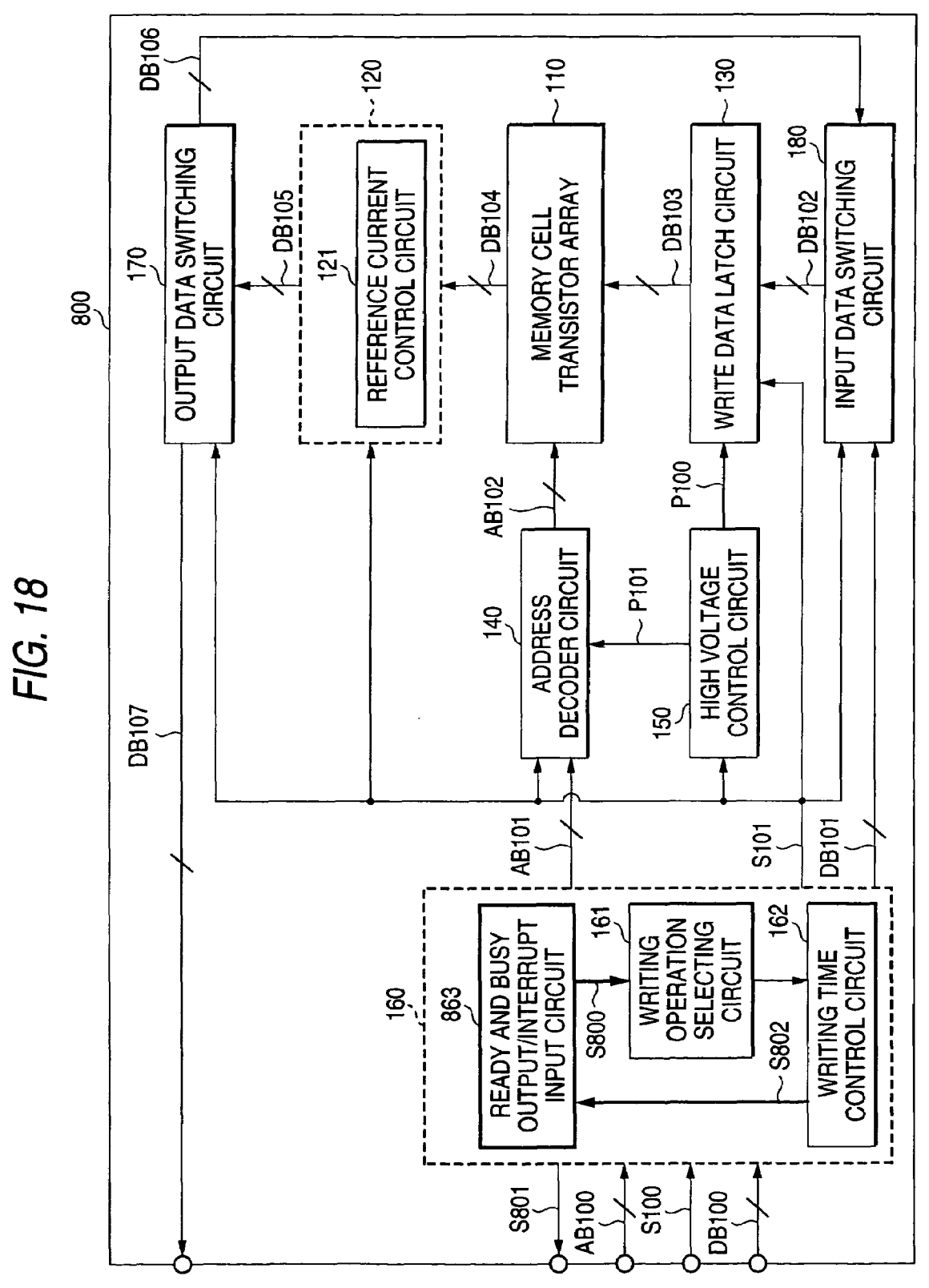

FIG. 18 is a block diagram of an EEPROM according to the eighth embodiment.

As shown in FIG. 18, an EEPROM 800 includes a ready and busy output/interrupt input circuit 863, a ready and busy output/interrupt input control signal S800, a ready and busy output signal S801 and a writing time control signal S802 which are merely different from the first embodiment of the present invention. The EEPROM has the same structures as those of other members than the above-described members designated by the same reference numerals and described in the first embodiment of the present invention.

During the additional writing operation, an input data switching circuit 180 fetches the input of a write data transfer bus DB106 and outputs to a write data latch circuit 130. Thus, new write data cannot be fetched from a write data bus DB101. Therefore, a ready and busy output circuit is provided for outputting the inhibition of the input of a writing instruction to the host device during the additional writing operation.

Further, an interrupt input circuit is provided. In this interrupt input circuit, when the writing instruction is inputted while the additional writing operation is performed, after the additional writing operation is completed for a writing block in which the additional writing operation is performed, the input of the writing instruction is permitted without performing the additional writing operation for other writing blocks.

Thus, during performing the additional writing operation, it is possible to recognize that the host device cannot input the writing instruction in accordance with a ready and busy signal. Further, an interrupt signal is inputted from the host device so that the additional writing operation for a next writing block can be stopped. After the additional writing operation is stopped, the writing instruction can be inputted from the host device, so that a waiting time for the input of a temporary writing instruction of the host device can be shortened.

Ninth Embodiment

Now, a ninth embodiment of the present invention will be described by referring to FIG. 19.

Figure 19:
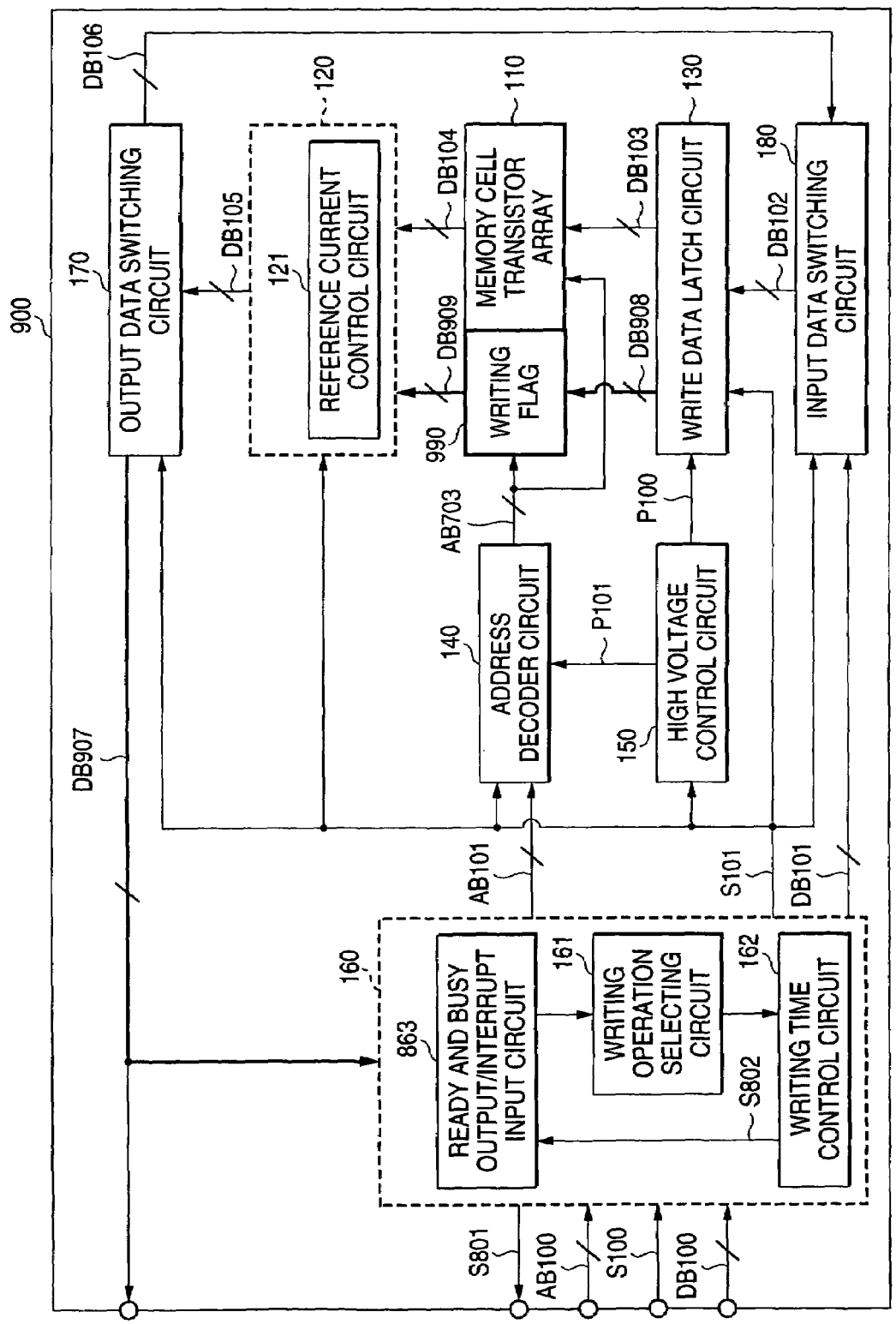
FIG. 19 is a block diagram of a semiconductor nonvolatile storage device according to a ninth embodiment.

FIG. 19 is a block diagram of an EEPROM according to the ninth embodiment.

As shown in FIG. 19, an EEPROM 900 includes a writing flag 990 and a writing flag reading data bus DB909 which are merely different from the first embodiment of the present invention. The EEPROM has the same structures as those of other members than the above-described members designated by the same reference numerals and described in the first embodiment of the present invention.

The EEPROM 900 is controlled by an external signal to store and read data. Reference numeral 160 designates a control circuit to control the reading operation or the writing operation of the EEPROM 900. Reference numeral 863 designates a ready and busy output/interrupt input circuit to inform an external part whether or not the EEPROM operates. When an interrupt process signal is inputted from the external part, the ready and busy output/interrupt input circuit controls to receive an operating instruction from the external part when the currently performed operation is finished.

Reference numeral 161 designates a writing operation selecting circuit to select, upon writing data in the EEPROM 900, either an ordinary writing operation or a writing operation in a shorter time than that of the ordinary writing operation and control the operation. Reference numeral 162 designates a writing time control circuit to receive the selection of the operation of the writing operation selecting circuit 161 and control an ordinary writing operation time or a writing operation time of a shorter time than that of the ordinary writing operation.

Reference numeral 110 is a memory cell transistor array capable of electrically writing data or erasing data. 990 designates the writing flag for storing by which of the ordinary writing operation or the writing operation for a shorter time than that of the ordinary writing operation selected by the writing operation selecting circuit 161, the data is written for each of writing block units.

Reference numeral 150 designates a high voltage control circuit to receive the control signal inputted from the control circuit 160 and erase the data of the memory cell transistor array 110 or control high voltage for writing. 140 designates an address decoder circuit to select the memory cell transistor array 110, erase the data or apply high voltage inputted from the high voltage control circuit 150 to the memory cell transistor array 110 upon writing operation.

Reference numeral 120 designates a sense amplify circuit to read the data of the memory cell transistor array 110 and the writing flag 990. 130 designates a write data latch circuit to temporarily hold data to be written in the memory cell transistor array 110 and data to be written in the writing flag 990.

180 designates an input data switching circuit for controlling to input either output data from the sense amplify circuit 120 or write data from the control circuit 160 to the write data latch circuit 130. 170 designates an output data switching circuit to switch whether the data outputted from the sense amplify circuit 120 is outputted to an external part or to the input data switching circuit 180.

Accordingly, whether the state that the data is written in the memory cell transistor array 110 is the ordinary writing state or the temporary writing state in a shorter time than that of the ordinary writing state can be managed for each of the writing block units by the writing flag 990. The state of the writing flag 990 is read out to discriminate whether or not the additional writing operation is necessary for the memory cell transistor array 110 of a certain writing block unit.

Therefore, an operation for additionally writing data can be performed only for the writing block of the memory cell transistor array 110 in which the temporary writing operation in a shorter time than that of the ordinary writing operation is performed.

The above-described operation sequence is described below. When the temporary writing operation is performed in all the writing blocks of the memory cell transistor array 110 from the host device, the EEPROM 900 writes information of the temporary writing operation in the writing flag 990 at the same time.

Then, when the host device performs other operations, the control circuit 160 detects it and the EEPROM 900 performs the additional writing operation in a background. When the EEPROM reads the data of the writing flag 990 of a certain address and the control circuit 160 discriminates that this data is temporarily written data, the control circuit sends the data of this address to the write data latch circuit 130 through the output data switching circuit 170 and the input data switching circuit 180 to perform the additional writing operation. The additional writing operation is performed so that the data is more assuredly written in the memory cell transistor array 110.

When the additional writing operation is carried out, information showing the ordinary writing operation is simultaneously written in the writing flag 990. Here, when the host device sends a reading instruction to the EEPROM 900 from an input signal S100, the EEPROM 900 finishes an operation up to a currently performed additional writing operation even when there is the memory cell transistor array 110 in which only the temporary writing operation has been yet completed.

At this time, a signal showing a busy state is outputted from the ready and busy output/interrupt input circuit until the currently performed additional writing operation is completed. After the additional writing operation is completed, a ready signal is outputted to inform the host device that a preparation is made for receiving another instruction. The EEPROM 900 receives a new instruction form the host device to read data.

After that, when the host device does not access the EEPROM 900, the EEPROM 900 performs again the additional writing operation. At this time, the EEPROM reads the writing flag to discriminate in which address only the temporary writing operation has been yet performed and perform the additional writing operation only in a writing block which needs the additional writing operation.

Consequently, an erroneous operation that data is further additionally written in the writing block in which the additional writing operation has been already completed can be eliminated. Thus, the data can be efficiently additionally written.

Further, since unnecessary voltage may not be applied to the memory cell transistor array 110, the reliability of the memory cell can be also improved.

Further, the host device needs to wait only for a time necessary for the temporary writing operation upon writing data and can interrupt the operation to perform other operations such as reading data even during the additional writing operation.

Tenth Embodiment

Now, a tenth embodiment of the present invention will be described by referring to FIG. 20.

Figure 20:
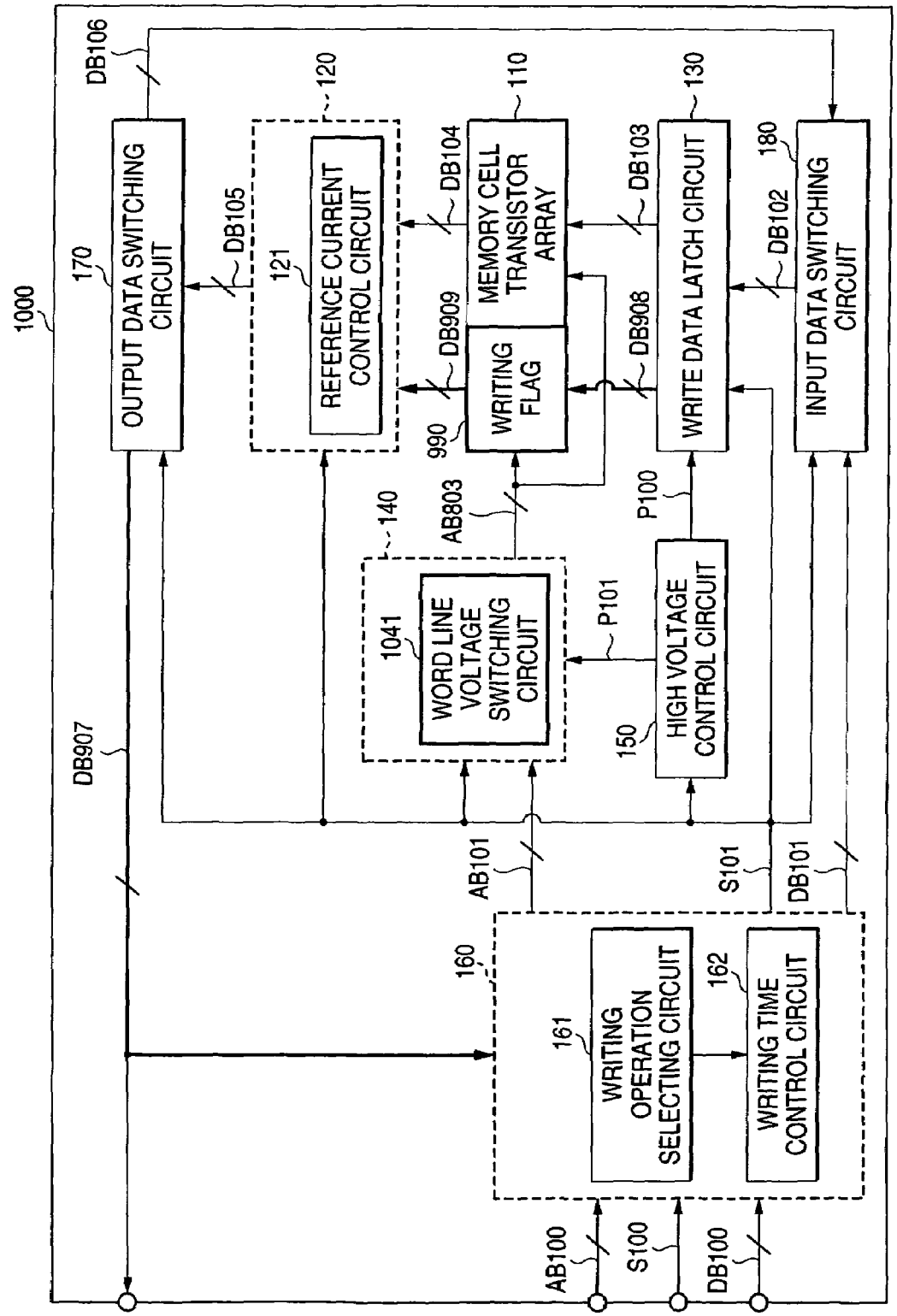
FIG. 20 is a block diagram of a semiconductor nonvolatile storage device according to a tenth embodiment.

FIG. 20 is a block diagram of an EEPROM according to the tenth embodiment.

As shown in FIG. 20, the EEPROM 1000 includes a word line voltage switching circuit 1041 which is merely different from the first embodiment or the ninth embodiment. The EEPROM has the same structures as those of other members than the above-described member designated by the same reference numerals and described in the first embodiment or the ninth embodiment of the present invention.

The EEPROM 1000 is controlled by an external signal to store and read data.

Reference numeral 160 designates a control circuit to control the reading operation or the writing operation of the EEPROM 1000. Reference numeral 161 designates a writing operation selecting circuit to select, upon writing data in the EEPROM 1000, either an ordinary writing operation or a temporary writing operation performed in a shorter time than that of the ordinary writing operation and control the operation.

Reference numeral 162 designates a writing time control circuit to receive the selection of the operation of the writing operation selecting circuit 161 and control an ordinary writing operation time or a temporary writing operation time. Reference numeral 110 is a transistor array capable of electrically writing data or erasing data.

990 designates the writing flag for storing by which of the ordinary writing operation or the temporary writing operation for a shorter time than that of the ordinary writing operation selected by the writing operation selecting circuit 161, the data is written for each of writing block units.

Reference numeral 150 designates a high voltage control circuit to receive the control signal inputted from the control circuit 160 and control high voltage applied to the memory cell transistor array 110. 140 designates an address decoder circuit to select the memory cell transistor array 110 and apply high voltage inputted from the high voltage control circuit 150 to the memory cell transistor array 110 upon operation.

Reference numeral 1041 designates the word line voltage switching circuit to apply the prescribed voltage of the high voltage inputted from the high voltage control circuit 150 to a word line in the memory cell transistor array 110 designated by the address decoder circuit 140. Reference numeral 120 designates a sense amplify circuit to read the data of the memory cell transistor array 110 and the writing flag 990.

Reference numeral 130 designates a write data latch circuit to temporarily hold data to be written in the memory cell transistor array 110 and data to be written in the writing flag 990. 180 designates an input data switching circuit for controlling either output data from the sense amplify circuit 120 or write data from the control circuit 160 to be inputted to the write data latch circuit 130.

Reference numeral 170 designates an output data switching circuit to switch whether the data outputted from the sense amplify circuit 120 is outputted to an external part or to the input data switching circuit 180.

Accordingly, whether the state that the data is written in the memory cell transistor array 110 is the ordinary writing state or the temporary writing state can be managed for each of the writing block units by the writing flag 990.

Here, in the memory cell under the temporary writing state, the data may be advantageously written in the memory cell in a short time. However, since the data is lightly written, the sense amplify circuit 120 is slow in deciding the data. As a result, reading speed is disadvantageously delayed.

Accordingly, the data in the writing flag 990 is previously read upon reading data and reading voltage applied to a word line is changed by the word line voltage switching circuit in a memory cell under a temporarily written state. Thus, the reading speed can be accelerated. Therefore, a user can use the EEPROM 1000 at the same reading speed as ordinary reading speed without considering the deterioration of the reading speed of the memory cell which occurs due to the temporary writing operation.

Eleventh Embodiment

Now, an eleventh embodiment of the present invention will be described by referring to FIG. 21.

Figure 21:
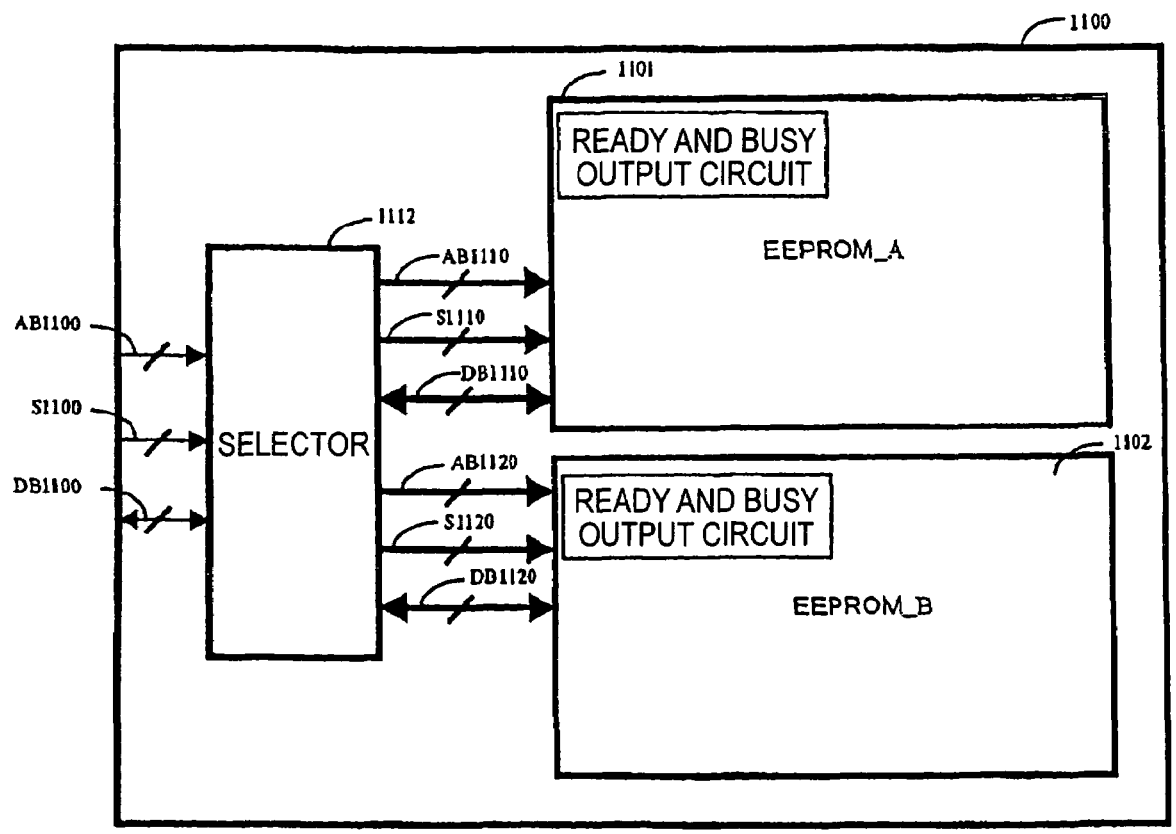
FIG. 21 is a block diagram of a semiconductor nonvolatile storage device according to an eleventh embodiment.

FIG. 21 is a block diagram of an EEPROM according to the eleventh embodiment.

As shown in FIG. 21, an EEPROM 1100 includes an EEPROM-A 1101, an EEPROM-B1102, a selector 1112, control signals S1100, S1110 and S1120, data buses DB1100, DB1110, and DB1120 and address buses AB1100, AB 1110 and AB 1120 which are merely different from the first embodiment of the present invention. The EEPROM has the same structures as those of other members than the above-described members designated by the same reference numerals and described in the first embodiment of the present invention.

The EEPROM 1100 is controlled by an external control signal to store and read data. Reference numeral 1112 designates the selector. Reference numerals 1101 and 1102 respectively designate the EEPROM-A and the EEPROM-B. The selector 1112 receives the external signal inputted to the EEPROM 1100 to independently control the EEPROM-A 1101 and the EEPROM-B 1102.

According to a usual circuit structure, when data is written in all memory cell transistor arrays of an EEPROM-A 1101 and an EEPROM-B 1102, an ordinary writing operation needs to be performed in all the memory cell transistor arrays. Thus, a user must wait until all the data is completely written.

Accordingly, as in the present structure, a temporary writing operation is firstly performed to write data in all memory cell transistor arrays.

Then, when the EEPROM-A 1101 operates, the EEPROM-B 1102 additionally writes data in the memory cell transistor array in a background. When the EEPROM-B 1102 operates, the EEPROM-A 1101 additionally writes data in the memory cell transistor array in the background. Therefore, the user needs only a writing time for the temporary writing operation to write the data in all the space of the EEPROM 1100.

Accordingly, the waiting time of the user can be reduced relative to the writing time of the data and the EEPROM 1100 can be more efficiently used.

Twelfth Embodiment

Now, a twelfth embodiment of the present invention will be described by referring to FIG. 22.

Figure 22:
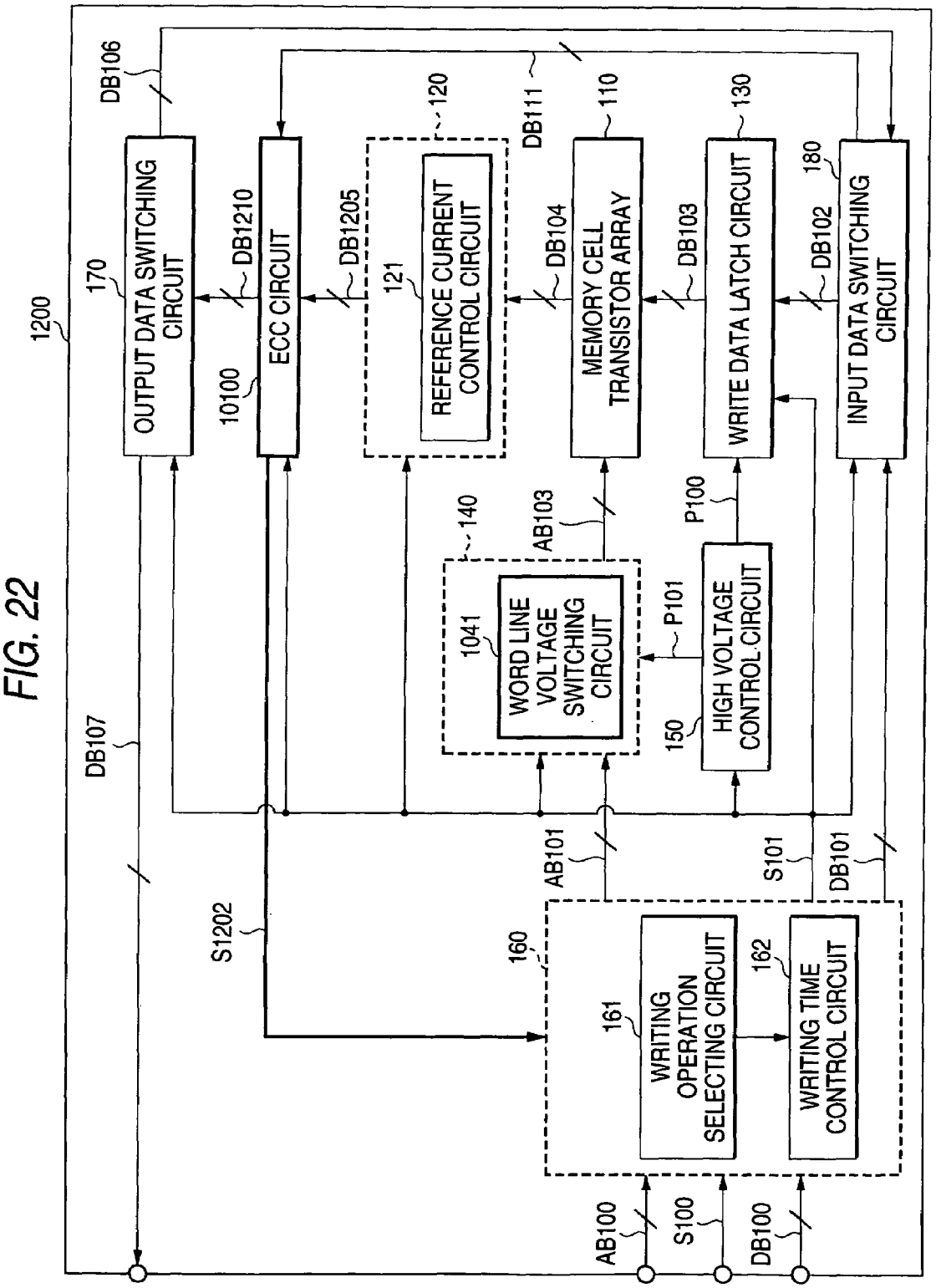
FIG. 22 is a block diagram of a semiconductor nonvolatile storage device according to a twelfth embodiment.

FIG. 22 is a block diagram of an EEPROM according to the twelfth embodiment.

As shown in FIG. 22, an EEPROM 1200 includes an ECC circuit 10100 and an ECC output signal S1202 which are merely different from the first embodiment of the present invention. The EEPROM has the same structures as those of other members than the above-described members designated by the same reference numerals and described in the first embodiment of the present invention.

The EEPROM 1200 is controlled by an external signal to store and read data. Reference numeral 160 designates a control circuit to control the reading operation or the writing operation of the EEPROM 1200. Reference numeral 161 designates a writing operation selecting circuit to select, upon writing data in the EEPROM 1200, either an ordinary writing operation or a temporary writing operation and control the operation.

Reference numeral 162 designates a writing time control circuit to receive the selection of the operation of the writing operation selecting circuit 161 and control an ordinary writing operation time or a temporary writing operation time shorter than the ordinary writing operation time. Reference numeral 110 is a memory cell transistor array capable of electrically writing data or erasing data.

Reference numeral 150 designates a high voltage control circuit to receive the control signal inputted from the control circuit 160 and erase the data of the memory cell transistor array 110 or control high voltage for writing.

Reference numeral 140 designates an address decoder circuit to apply high voltage inputted from the high voltage control circuit 150 to the memory cell transistor array 110 when the memory cell transistor array 110 is selected to erase data or write data. Reference numeral 120 designates a sense amplify circuit to read the data of the memory cell transistor array 110.

Reference numeral 130 designates a write data latch circuit to temporarily hold data to be written in the memory cell transistor array 110.

Reference numeral 180 designates an input data switching circuit for controlling either output data from the sense amplify circuit 120 or write data from the control circuit 160 to be inputted to the write data latch circuit 130.

Reference numeral 170 designates an output data switching circuit to switch whether the data outputted from the sense amplify circuit 120 is outputted to an external part or to the input data switching circuit 180.

Reference numeral 10100 designates the ECC circuit to generate error correcting bits from data to be actually written upon writing the data and write error correcting data in the memory cell transistor array 110 as well as the actual data.

When the data is read, the actual data and the error correcting data are read at the same time. When the data is erroneously read, the data undergoes a computing process to correct the erroneous data to normal data and output the data to an external part.

Accordingly, even if the writing operation for a shorter time than that of the ordinary writing operation is performed so that the data is not adequately written and the read data is outputted as erroneous data by the sense amplify circuit 120, the data can be corrected to the normal data by the ECC circuit 10100 and outputted to the external part.

Further, when the ECC circuit 10100 detects that the read data is corrected, normal data is additionally written to the data of the address. Thus, the reliability of the data of the EEPROPM 1200 for the temporary writing operation can be also improved.

As specifically described above, according to the semiconductor nonvolatile storage device of the present invention, two kinds of operations including the temporary writing operation and the additional writing operation can be performed as the writing system for the same nonvolatile memory cell transistor array. Thus, the writing time is effectively shortened by the temporary writing operation for the writing instruction from the host device and the reliability of the data is effectively ensured by the subsequent additional writing operation.

It is to be understood that a plurality of embodiments are combined together to further effectively shorten the writing time relative to the host device.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A nonvolatile semiconductor storage device comprising:
    a writing means having a first writing function for writing same write data in a memory cell in a first writing level and a second writing function for writing in a second writing level which is different from the first writing level; and
    a writing level selecting means for selecting any one of the first writing level and the second writing level for every writing area.

2. The nonvolatile semiconductor storage device according to claim 1, further including:
    a discriminating means for discriminating data written in the memory cell in the first writing level by the first writing function of the writing means;
    a write data holding means for holding the data discriminated by the discriminating means; and
    an additional writing means for additionally writing by using the data held by the write data holding means.

3. The nonvolatile semiconductor storage device according to claim 2, further including:
    a verifying means for discriminating whether or not the data is normally written in the first level by the writing means.

4. The nonvolatile semiconductor storage device according to claim 1, further including:
a writing voltage setting means for controlling the set value of writing voltage in accordance with the writing level.

5. The nonvolatile semiconductor storage device according to claim 2, wherein an erasing operation is performed before the additional writing operation is performed.

6. The nonvolatile semiconductor storage device according to claim 2, further including:
an erasing operation selecting means for selecting a primary erasing operation and a secondary erasing operation having a prescribed erasing time for the memory cell; and
an erasing time control circuit for controlling an erasing time in accordance with the output signal of the erasing operation selecting circuit.

7. A writing method of a nonvolatile semiconductor storage device comprising:
selecting of any one of a first writing operation for writing same write data for every writing area in a memory cell in a first writing level and a second writing operation for writing in a second writing level which is different from the first writing level; and
performing the selected writing operation.

8. The writing method of a nonvolatile semiconductor storage device according to claim 7, wherein the second writing operation which writes in the second writing level higher than the first writing level is performed after the first writing operation is performed.

9. The writing method of a nonvolatile semiconductor storage device according to claim 8, further including:
a verifying operation of discriminating whether or not the data is normally written in the memory cell by the first writing operation.

10. The writing method of a nonvolatile semiconductor storage device according to claim 8, wherein the second writing operation uses the discriminated data.

11. The writing method of a nonvolatile semiconductor storage device according to claim 8, wherein the set value of writing voltage is controlled by the selected writing operation.

12. A host device data storage system comprising:
a nonvolatile semiconductor storage device which has a first writing function for writing same writing date in a memory cell in a first writing level and a second writing function for writing in a second writing level which is different from the first writing level, and comprises a writing level selecting means for selecting any one of the first writing level and the second writing level for every writing area; and
a mode of additionally writing the data written in a first writing level into a second writing level.

13. The host device data storage system according to claim 12, wherein the host device data storage system has two types of writing commands which is capable of selecting any one of the first and the second writing functions, and the system further comprises a host device for outputting the writing commands to the nonvolatile semiconductor storage device.

14. The host device data storage system according to claim 13,
wherein the nonvolatile semiconductor storage device comprises a circuit for controlling the first writing function and the second writing function.

15. The host device data storage system according to claim 12, further including:
a selector for selecting any of a plurality of the nonvolatile semiconductor storage devices and controlling the operation thereof.

16. The host device data storage system according to claim 15, further including:
a ready/busy output circuit for outputting an inhibition instruction of the input of the write data to the selector while the additional writing operation is performed.

17. A nonvolatile semiconductor storage device comprising:
a writing operation selecting circuit for selecting, for the same data in a memory cell, a first writing operation for writing in a first writing level and a second writing function for writing in a second writing level which is different from the first writing level; and
an address decoder circuit for outputting the writing signal of the writing operation selecting circuit to the memory cell by selecting for the writing area.

18. The nonvolatile semiconductor storage device according to claim 17, further including:
a verifying operation control circuit for discriminating whether or not the data is normally written in the memory cell by the first writing operation, and
a verifying circuit for performing the verifying operation in accordance with the output signal of the verifying operation control circuit.

19. The nonvolatile semiconductor storage device according to claim 18, wherein the verifying operation control circuit is a reference current control circuit for controlling the set value of reference current.

20. The nonvolatile semiconductor storage device according to claim 17, wherein the verifying operation control circuit is a reading voltage set circuit for setting the set value of word line voltage to the temporary reading voltage.

21. The nonvolatile semiconductor storage device according to claim 17, further including:
a writing voltage control circuit for controlling the set value of writing voltage in accordance with the output signal of the writing operation selecting circuit.

22. The nonvolatile semiconductor storage device according to claim 17, further including:
a writing time control circuit for controlling the writing time in accordance with the output signal of the writing operation selecting circuit.

23. The nonvolatile semiconductor storage device according to claim 17, further including:
an erasing operation selecting circuit for selecting a primary erasing operation and a secondary erasing operation having a prescribed erasing time for the memory cell transistor element; and
an erasing time control circuit for controlling an erasing time in accordance with the output signal of the erasing operation selecting circuit.

24. The nonvolatile semiconductor storage device according to claim 17, further including:
a reading operation selecting circuit capable of selecting a temporary reading operation after the temporary writing operation and a reading operation after the additional writing operation.

25. The nonvolatile semiconductor storage device according to claim 24, further including:
a reading voltage setting circuit to which the output signal of the reading operation selecting circuit is connected, and in which when the output signal indicates the temporary reading operation, the set value of word line voltage is set to temporary reading voltage.

26. The nonvolatile semiconductor storage device according to claim 24, further including:
a reference current setting circuit for allowing reference current as a decision current to flow to the memory cell transistor element when read data is decided and controlling the set value of the reference current in accordance with the output signal of the reading operation selecting circuit.

27. The nonvolatile semiconductor storage device according to claim 24, further including:
a reference current control circuit for discriminating the write data by the first writing operation of the first level of the writing means in the memory cell;
a write data latch circuit for holding the data discriminated by the reference current control circuit; and
a verify circuit for performing the additional writing operation by using the data held in the write data holding means.

28. The nonvolatile semiconductor storage device according to claim 27, wherein the write data holding circuit includes a latch provided at the rate of one for each bit line or several bit lines and a transfer gate electrode for electrically separating the latch from the bit line, and further comprises a bit line potential detecting circuit for detecting the voltage of the bit line and a latch invert circuit for inverting the data of the latch in accordance with the output of the bit line potential detecting circuit.

29. The nonvolatile semiconductor storage device according to claim 24, further including:
an interrupt input circuit in which data is written for each writing block in a memory cell transistor array and when a writing instruction is inputted during performing the additional writing operation, the input of the writing instruction is permitted without performing the additional writing operation in order writing block after the additional writing operation is completed.

30. The nonvolatile semiconductor storage device according to claim 24, further including:
a ready/busy output circuit for informing about the inhibition of the input of write data while the additional writing operation is performed.

31. The nonvolatile semiconductor storage device according to claim 24, further including:
a writing flag for storing whether the writing operation data for each writing block in the memory cell transistor array is carried out after the temporary writing operation or after the additional writing operation for each writing block.

32. The nonvolatile semiconductor storage device according to claim 31, wherein the additional writing operation is controlled to be performed for the writing block after the temporary writing operation on the basis of the information of the writing flag.

33. The nonvolatile semiconductor storage device according to claim 32, further including:
a word line voltage switching circuit for changing the reading voltage applied to a word line upon reading operation on the basis of the information of the writing flag.

34. The nonvolatile semiconductor storage device according to claim 32, further comprising:
a reference current control circuit for controlling the set value of reference current on the basis of the information of the writing flag.

35. The nonvolatile semiconductor storage device according to claim 33, wherein an ECC circuit is further provided.

* * * * *